US010601659B2

(12) United States Patent
Chen et al.

(10) Patent No.: US 10,601,659 B2
(45) Date of Patent: Mar. 24, 2020

(54) METHODS TO SIGNAL CURRENT MIMO RX ANTENNA CONFIGURATION STATUS

(71) Applicant: Telefonaktiebolaget LM Ericsson (publ), Stockholm (SE)

(72) Inventors: Maomao Chen, Arlöv (SE); Fredrik Nordström, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 386 days.

(21) Appl. No.: 15/007,444

(22) Filed: Jan. 27, 2016

(65) Prior Publication Data
US 2016/0226709 A1 Aug. 4, 2016

Related U.S. Application Data

(60) Provisional application No. 62/109,300, filed on Jan. 29, 2015.

(51) Int. Cl.
*H04L 12/50* (2006.01)
*H04L 12/24* (2006.01)
(Continued)

(52) U.S. Cl.
CPC ........ *H04L 41/0853* (2013.01); *G01R 29/105* (2013.01); *H04B 7/0413* (2013.01);
(Continued)

(58) Field of Classification Search
CPC ....................................................... H94W 4/00
(Continued)

(56) References Cited

U.S. PATENT DOCUMENTS 8,873,662 B2   10/2014   Sesia et al.
8,873,665 B2   10/2014   Clevorn
(Continued)

FOREIGN PATENT DOCUMENTS

EP   1865642 A1   12/2007
WO   2012167476 A1   12/2012

OTHER PUBLICATIONS

3GPP TSG RAN Meeting # 66, RP-142299; Ericsson, "New Study Item: Study on LTE DL 4 Rx antenna ports," Maui, Hawaii, USA, Dec. 8-11, 2014.
(Continued)

Primary Examiner — Dang T Ton
(74) Attorney, Agent, or Firm — Coats + Bennett, PLLC

(57) ABSTRACT

In MIMO wireless communication networks, receiver MIMO antenna parameters are not static over time. For example, the MIMO channel correlation is higher for high frequency bands than for low frequency bands. This variability of the receiver antenna parameters introduces uncertainty based the reported CSI (e.g., CQI, PMI, RI) if the network uses only static assumptions for such antenna parameter values. In embodiments, the UE determines the current status of its receive antenna parameters—such as number, configuration, correlation, and power imbalance—and transmits this information to the network (e.g., serving BS). The network node then based on the received information performs one or more radio operational tasks leading to more efficient use of radio resources and enhanced system performance.

23 Claims, 13 Drawing Sheets

(51) Int. Cl.

| | |
|---|---|
| *H04B 17/21* | (2015.01) |
| *H04B 17/318* | (2015.01) |
| *H04B 17/327* | (2015.01) |
| *H04B 7/06* | (2006.01) |
| *H04B 17/00* | (2015.01) |
| *G01R 29/10* | (2006.01) |
| *H04L 1/00* | (2006.01) |
| *H04B 7/0417* | (2017.01) |
| *H04W 52/24* | (2009.01) |
| *H04L 1/06* | (2006.01) |
| *H04B 7/0413* | (2017.01) |
| *H04L 5/00* | (2006.01) |
| *H04W 72/04* | (2009.01) |

(52) U.S. Cl.
CPC .......... *H04B 7/0417* (2013.01); *H04B 7/063* (2013.01); *H04B 7/066* (2013.01); *H04B 7/0643* (2013.01); *H04B 17/0085* (2013.01); *H04B 17/0087* (2013.01); *H04B 17/21* (2015.01); *H04B 17/318* (2015.01); *H04B 17/327* (2015.01); *H04L 1/0007* (2013.01); *H04L 1/0015* (2013.01); *H04L 1/0022* (2013.01); *H04L 1/0023* (2013.01); *H04L 1/0026* (2013.01); *H04L 1/0027* (2013.01); *H04L 1/06* (2013.01); *H04L 5/0048* (2013.01); *H04W 52/245* (2013.01); *H04W 72/0453* (2013.01); *H04L 1/0003* (2013.01); *H04L 1/0009* (2013.01)

(58) Field of Classification Search
USPC ........................................................ 370/329
See application file for complete search history.

(56) References Cited

U.S. PATENT DOCUMENTS

| | | | |
|---|---|---|---|
| 2012/0115531 A1 | 5/2012 | Gaal et al. | |
| 2013/0051261 A1 | 2/2013 | Kazmi et al. | |
| 2013/0242794 A1 | 9/2013 | Liu et al. | |
| 2014/0140424 A1* | 5/2014 | Clevorn | H04B 7/0417 375/267 |
| 2014/0241146 A1 | 8/2014 | Mahadevan et al. | |
| 2014/0328422 A1* | 11/2014 | Chen | H04B 7/0486 375/267 |
| 2014/0376652 A1* | 12/2014 | Sayana | H04B 7/0456 375/267 |
| 2015/0230266 A1* | 8/2015 | Sung | H04B 7/0413 370/329 |
| 2016/0249243 A1* | 8/2016 | Kim | H04W 24/10 |
| 2017/0054482 A1* | 2/2017 | Forenza | H04B 7/0456 |
| 2017/0295593 A1* | 10/2017 | Kim | H04W 72/1289 |

OTHER PUBLICATIONS

3GPP TS 25.214 V13.1.0 (Dec. 2015); 3rd Generation Partnership Project; Technical Specification Group Radio Access Network; Physical layer procedures (FDD) (Release 13).

3GPP TS 36.101 V8.0.0 (Dec. 2007); 3rd Generation Partnership Project; Technical Specification Group Radio Access Network; Evolved Universal Terrestrial Radio Access (E-UTRA); User Equipment (UE) radio transmission and reception (Release 8).

3GPP TS 36.213 V8.2.0 (Mar. 2008); 3rd Generation Partnership Project; Technical Specification Group Radio Access Network; Evolved Universal Terrestrial Radio Access (E-UTRA); Physical layer procedures (Release 8).

3GPP TR 37.977 V12.1.0 (Oct. 2014); Universal Mobile Telecommunications System (UMTS); LTE; Universal Terrestrial Radio Access (UTRA) and Evolved Universal Terrestrial Radio Access (E-UTRA); Verification of radiated multi-antenna reception performance of User Equipment (UE) (Release 12).

3GPP TSG RAN WG1 Meeting #66, R1-112045; Huawei, HiSilicon, "Prioritization of real-life network deployment issues," Athens, Greece, Aug. 22-26, 2011.

Ericsson, "Robustness test for 4Rx UEs under fallback", 3GPP TSG-RAN WG4 Meeting #76bis, Oct. 12-16, 2015, pp. 1-16, Sophia Antipolis, France, R4-155911.

\* cited by examiner

METHODS TO SIGNAL CURRENT MIMO RX ANTENNA CONFIGURATION STATUS

RELATED APPLICATION

This application claims priority to U.S. Provisional Patent Application Ser. No. 62/109,300, filed Jan. 29, 2015, the disclosure of which is incorporated by reference herein, in its entirety.

FIELD OF INVENTION

The present invention relates generally to the field of wireless communications, and in particular to a system and method of signaling current MIMO receiver antenna configurations to the network.

BACKGROUND

Wireless communication systems continue to advance in sophistication, providing higher bandwidth, faster data rates, greater coverage, more efficient use of spectrum, and providing an ever-increasing breadth of services to subscribers. One technology that enhances bandwidth and data rates is the use of multiple transmit and receive antennas at one or both ends of the wireless channel, known as Multiple Input, Multiple Output (MIMO). Beginning with Release 10, up to eight layer MIMO transmission is supported in the 3GPP Long Term Evolution (LTE) standard.

The MIMO technique uses a commonly known notation (M×N) to represent MIMO configuration in terms number of transmit (M) and receive antennas (N). The common MIMO configurations used or currently discussed for various technologies are: (2×1), (1×2), (2×2), (4×2), (8×2) and (2×4), (4×4), (8×4). The configurations represented by (2×1) and (1×2) are special cases of MIMO.

A 4×4 MIMO system supports up to four layer spatial multiplexing. With four receiver antennas, an 8×4 MIMO system with four layer spatial multiplexing is capable of utilizing both beam forming and diversity gain in maximum level. These layers can be combined through dynamic beamforming and MIMO receiver processing to increase reliability and range. From a performance point of view, the use of four receiver antennas allows higher UE data rates in a wide range of scenarios and improved receiver sensitivity in general. Depending on the target SNR region, the transmission scheme used by the network, and the channel conditions, the peak throughput can be doubled compared to dual-layer multiplexing by virtue of additional diversity gain and/or multiplexing gain.

In prior art MIMO implementations, the network bases transmission parameters on static assumptions of UE antenna number, type, configuration, correlation, power imbalance, and the like. However, at least some of these UE antenna parameters may change over time and in dependence on channel conditions, operating band, available UE battery power, UE operating mode, physical orientation, and the like. When the use of static assumptions of UE antenna parameters by the network does not match actual UE antenna parameter values, system performance may not be optimal.

The Background section of this document is provided to place embodiments of the present invention in technological and operational context, to assist those of skill in the art in understanding their scope and utility. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

Embodiments of the present invention are motivated by the discovery that receiver MIMO antenna parameters are not static over time. For example, the MIMO channel correlation is lower for high frequency bands than for low frequency bands. This variability of the receiver antenna parameters introduces uncertainty based on the reported CSI (e.g., CQI, PMI, RI) if the network uses only static assumptions for such antenna parameter values. According to one or more embodiments described and claimed herein, the UE determines the current status of its receive antenna parameters—such as number, configuration, correlation, and power imbalance—and transmits this information to the network (e.g., serving BS). The network node then performs one or more radio operational tasks, based on the received information, leading to more efficient use of radio resources and enhanced system performance. For example, the network may more accurately adapt link adaptation and resource allocation scheduling.

One embodiment relates to a method, performed by user equipment (UE) having a plurality of receive antennas and being operative in a wireless communication network implementing Multiple Input, Multiple Output (MIMO) transmissions, of apprising the network of dynamically changing antenna parameters. For each active frequency band on which the UE is operating, an action is performed that is selected from the group consisting of: obtaining information whether the receive antennas are configured as a Uniform Linear Array (ULA) or as Cross Polarized (Xpol), determining a correlation among the receive antennas, and determining a power imbalance among the receive antennas. Information is transmitted to the network indicative of at least one of the receive antenna configuration, correlation, and power imbalance.

Another embodiment relates to a method, performed by a network node operative in a wireless communication network implementing Multiple Input, Multiple Output (MIMO) transmissions, of adjusting to dynamically changing user equipment (UE) antenna parameters. For each active frequency band on which the UE is operating: information indicative of at least one of a configuration, a correlation, and a power imbalance of receive antennas on the UE is received from the UE; and the UE receive antenna information is utilized to perform one or more radio operational or radio resource management tasks.

Yet another embodiment relates to a user equipment (UE) operative in a wireless communication network implementing Multiple Input, Multiple Output (MIMO) transmissions. The UE includes a plurality of receive antennas, memory, and a controller operatively connected to the memory and the receive antennas. For each active frequency band on which the UE is communicating, the controller is operative to: obtain information whether the receive antennas are configured as a Uniform Linear Array (ULA) or as Cross Polarized (Xpol); determine a correlation among the receive antennas; and determine a power imbalance among the receive antennas. The controller is further operative to transmit information to the network indicative of at least one of the receive antenna configuration, correlation, and power imbalance.

Still another embodiment relates to a network node operative in a wireless communication network implementing Multiple Input, Multiple Output (MIMO) transmissions. The network node includes a controller. For each active frequency band on which a user equipment (UE) is communicating, the controller is operative to: receive from the UE information indicative of at least one of a configuration, a correlation, and a power imbalance of receive antennas on the UE; and utilize the UE receive antenna information to perform one or more radio operational or radio resource management tasks.

Another embodiment relates to a non-transitory computer-readable storage medium, having stored thereon a computer program operative to cause a processor in a user equipment (UE) having two or more receive antennas to perform, for each active frequency band on which the UE communicates, the steps of: performing an action selected from the group consisting of obtaining information whether the receive antennas are configured as a Uniform Linear Array (ULA) or as Cross Polarized (Xpol), determining a correlation among the receive antennas, and determining a power imbalance among the receive antennas; and transmitting information to the network indicative of at least one of the receive antenna configuration, correlation, and power imbalance.

Another embodiment relates to a non-transitory computer-readable storage medium, having stored thereon a computer program operative to cause a processor in a network node to perform, for each active frequency band on which a user equipment (UE) communicates with the network node, the steps of: receiving from the UE information indicative of at least one of: a configuration, a correlation, and a power imbalance of receive antennas on the UE; and utilizing the UE receive antenna information to perform one or more radio operational or radio resource management tasks.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

Figure 1:
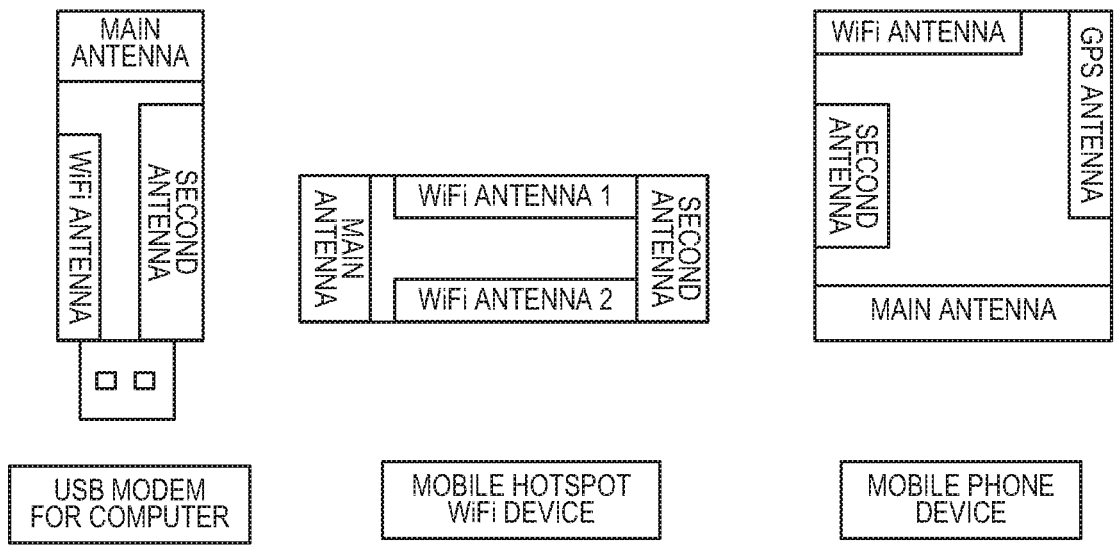
FIG. 1 depicts block diagrams of antenna configurations for LTE UE devices.

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

In some embodiments the non-limiting term radio network node or simply network node is used and it refers to any type of network node serving UE and/or connected to other network node or network element or any radio node from where UE receives signal. Examples of radio network nodes are Node B, base station (BS), multi-standard radio (MSR) radio node such as MSR BS, eNode B, network controller, radio network controller (RNC), base station controller (BSC), relay, donor node controlling relay, base transceiver station (BTS), access point (AP), transmission points, transmission nodes, RRU, RRH, nodes in distributed antenna system (DAS) etc.

In some embodiments the non-limiting term user equipment (UE) is used and it refers to any type of wireless device communicating with a radio network node in a cellular or mobile communication system. Examples of UE are target device, device to device (D2D) UE, machine type UE or UE capable of machine to machine (M2M) communication, PDA, iPAD, Tablet, mobile terminals, smart phone, laptop embedded equipped (LEE), laptop mounted equipment (LME), USB dongles etc.

The embodiments are described in particular for MIMO operation in EUTRA/LTE. The embodiments are however applicable to any RAT or multi-RAT system where the UE operates using MIMO e.g. UTRA/HSPA, GSM/GERAN, Wi Fi, WLAN, WMax, CDMA2000 etc.

The embodiments are applicable to single carrier as well as to multicarrier (MC) or carrier aggregation (CA) operation of the UE in conjunction with MIMO in which the UE is able to receive and/or transmit data to more than one serving cells using MIMO. The term carrier aggregation (CA) is also called (e.g. interchangeably called) "multi-carrier system", "multi-cell operation", "multi-carrier operation", "multi-carrier" transmission and/or reception. As used herein, the term "frequency band" refers to a range of frequencies $f_l \leq f_{c1}, f_{c2}, \ldots, f_{cn} \leq f_u$ where $f_l$ is a lower limit, $f_u$ is an upper limit, and $f_{c1}, f_{c2}, \ldots, f_{cn}$ are carrier frequencies within the band, in the case that a UE is in carrier aggregation with two or more carrier frequencies in the same frequency band. An "active frequency band" is a frequency band where a UE is in communication with the network on at least one carrier frequency within the frequency band.

The receiver for mitigating the multi-antenna inter-stream interference can be based on different kinds of implementation e.g. maximum likelihood (ML) with full blow search, R-ML (reduced complex ML), code word interference cancellation (CWIC) and symbol level IC (SLIC) etc.

Figure 2:
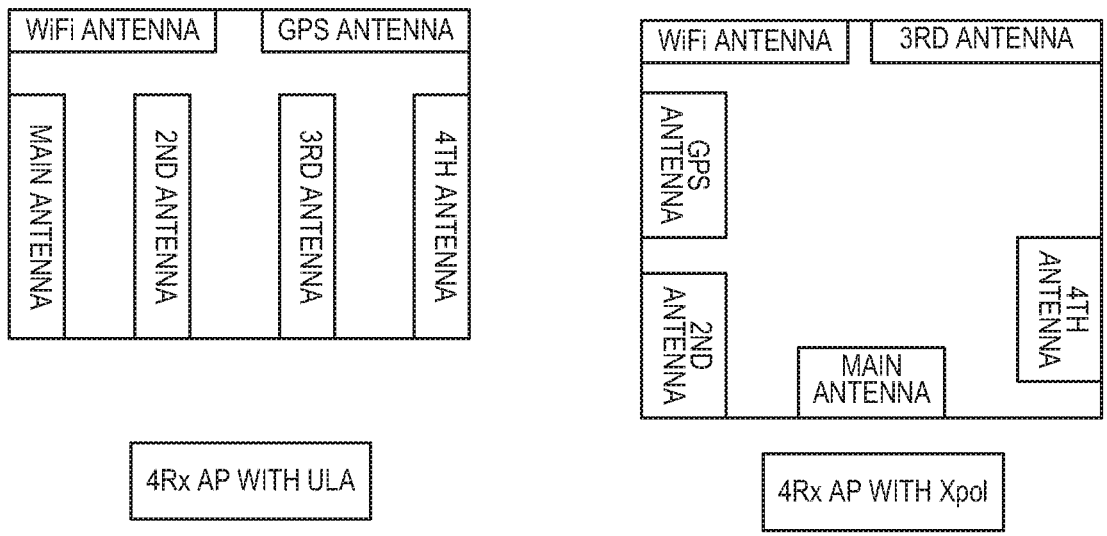
FIG. 2 depicts block diagrams of antenna configurations for 4-receiver-antenna MIMO devices.

The industry standard specification 3GPP TS 36.101 defines two UE antenna configurations: Uniform Linear Array (ULA) and Cross Polarized (Xpol). FIG. 1 depicts typical antenna configurations for LTE UE devices. The USB modem for a computer utilizes Xpol; the mobile Wi-Fi device uses ULA; and the mobile phone device uses Xpol. FIG. 2 depicts typical antenna configurations for 4-receiver-antenna MIMO devices, utilizing both ULA and Xpol. The channel correlation properties for both ULA and Xpol are discussed below.

ULA MIMO Channel Correlation

The following MIMO channel correlation matrices apply for the antenna configuration using Uniform Linear Arrays at both eNodeB and UE. Table 1 defines the correlation matrix for the eNodeB and Table 2 defines the correlation matrix for the UE.

TABLE 1 eNodeB correlation matrix

| | One antenna | Two antennas | Four antennas |
|---|---|---|---|
| eNode B Correlation | $R_{eNB} = 1$ | $R_{eNB} = \begin{pmatrix} 1 & \alpha \\ \alpha^* & 1 \end{pmatrix}$ | $R_{eNB} = \begin{pmatrix} 1 & \alpha^{1/9} & \alpha^{4/9} & \alpha \\ \alpha^{1/9*} & 1 & \alpha^{1/9} & \alpha^{4/9} \\ \alpha^{4/9*} & \alpha^{1/9*} & 1 & \alpha^{1/9} \\ \alpha^* & \alpha^{4/9*} & \alpha^{1/9*} & 1 \end{pmatrix}$ |

TABLE 2

UE correlation matrix

| | One antenna | Two antennas | Four antennas |
|---|---|---|---|
| UE Correlation | $R_{UE} = 1$ | $R_{UE} = \begin{pmatrix} 1 & \beta \\ \beta^* & 1 \end{pmatrix}$ | $R_{UE} = \begin{pmatrix} 1 & \beta^{1/9} & \beta^{4/9} & \beta \\ \beta^{1/9*} & 1 & \beta^{1/9} & \beta^{4/9} \\ \beta^{4/9*} & \beta^{1/9*} & 1 & \beta^{1/9} \\ \beta^* & \beta^{4/9*} & \beta^{1/9*} & 1 \end{pmatrix}$ |

Table 3 defines the channel spatial correlation matrix $R_{spat}$. The parameters $\alpha$ and $\beta$ in Table 3 define the spatial correlation between the antennas at the eNodeB and UE.

TABLE 3

$R_{spat}$ correlation matrices

1 × 2 case $\quad R_{spat} = R_{UE} = \begin{bmatrix} 1 & \beta \\ \beta^* & 1 \end{bmatrix}$ TABLE 3-continued $R_{spat}$ correlation matrices 2 × 2 case $$R_{spat} = R_{eNB} \otimes R_{UE} = \begin{bmatrix} 1 & \alpha \\ \alpha^* & 1 \end{bmatrix} \otimes \begin{bmatrix} 1 & \beta \\ \beta^* & 1 \end{bmatrix} = \begin{bmatrix} 1 & \beta & \alpha & \alpha\beta \\ \beta^* & 1 & \alpha\beta^* & \alpha \\ \alpha^* & \alpha^*\beta & 1 & \beta \\ \alpha^*\beta^* & \alpha^* & \beta^* & 1 \end{bmatrix}$$

4 × 2 case $$R_{spat} = R_{eNB} \otimes R_{UE} = \begin{bmatrix} 1 & \alpha^{1/9} & \alpha^{4/9} & \alpha \\ \alpha^{1/9*} & 1 & \alpha^{1/9} & \alpha^{4/9} \\ \alpha^{4/9*} & \alpha^{1/9*} & 1 & \alpha^{1/9} \\ \alpha^* & \alpha^{4/9*} & \alpha^{1/9*} & 1 \end{bmatrix} \otimes \begin{bmatrix} 1 & \beta \\ \beta^* & 1 \end{bmatrix}$$

4 × 4 case $$R_{spat} = R_{eNB} \otimes R_{UE} = \begin{bmatrix} 1 & \alpha^{1/9} & \alpha^{4/9} & \alpha \\ \alpha^{1/9*} & 1 & \alpha^{1/9} & \alpha^{4/9} \\ \alpha^{4/9*} & \alpha^{1/9*} & 1 & \alpha^{1/9} \\ \alpha^* & \alpha^{4/9*} & \alpha^{1/9*} & 1 \end{bmatrix} \otimes \begin{pmatrix} 1 & \beta^{1/9} & \beta^{4/9} & \beta \\ \beta^{1/9*} & 1 & \beta^{1/9} & \beta^{4/9} \\ \beta^{4/9*} & \beta^{1/9*} & 1 & \beta^{1/9} \\ \beta^* & \beta^{4/9*} & \beta^{1/9*} & 1 \end{pmatrix}$$

For cases with more antennas at either the eNodeB or UE (or both), the channel spatial correlation matrix can still be expressed as the Kronecker product of $R_{eNB}$ and $R_{UE}$ according to $R_{spat}=R_{eNB} \otimes R_{UE}$. The $\alpha$ and $\beta$ for different correlation types are given in Table 4.

TABLE 4

Correlation parameters for ULA

| Low correlation | | Medium Correlation | | High Correlation | |
|---|---|---|---|---|---|
| α | β | α | β | α | β |
| 0 | 0 | 0.3 | 0.9 | 0.9 | 0.9 |

The correlations matrices for high, medium, and low correlation are calculated according to the equation $R_{high}=[R_{spatial}+aI_n]/(1+a)$ where the value "a" is a scaling factor such that the smallest value is used to obtain a positive semi-definite result. The results are listed in tables 5, 6, and 7 below. For the 4×2 high correlation case, a=0.00010. For the 4×4 high correlation case, a=0.00012.

The values in Table 5 have been adjusted for the 4×2 and 4×4 high correlation cases to insure the correlation matrix is positive semi-definite after round-off to 4 digit precision.

TABLE 5

ULA MIMO correlation matrices for high correlation

1 × 2 case $$R_{high} = \begin{pmatrix} 1 & 0.9 \\ 0.9 & 1 \end{pmatrix}$$

2 × 2 case $$R_{high} = \begin{pmatrix} 1 & 0.9 & 0.9 & 0.81 \\ 0.9 & 1 & 0.81 & 0.9 \\ 0.9 & 0.81 & 1 & 0.9 \\ 0.81 & 0.9 & 0.9 & 1 \end{pmatrix}$$

4 × 2 case $$R_{high} = \begin{bmatrix} 1.0000 & 0.8999 & 0.9883 & 0.8894 & 0.9542 & 0.8587 & 0.8999 & 0.8099 \\ 0.8999 & 1.0000 & 0.8894 & 0.9883 & 0.8587 & 0.9542 & 0.8099 & 0.8999 \\ 0.9883 & 0.8894 & 1.0000 & 0.8999 & 0.9883 & 0.8894 & 0.9542 & 0.8587 \\ 0.8894 & 0.9883 & 0.8999 & 1.0000 & 0.8894 & 0.9883 & 0.8587 & 0.9542 \\ 0.9542 & 0.8587 & 0.9883 & 0.8894 & 1.0000 & 0.8999 & 0.9883 & 0.8894 \\ 0.8587 & 0.9542 & 0.8894 & 0.9883 & 0.8999 & 1.0000 & 0.8894 & 0.9883 \\ 0.8999 & 0.8099 & 0.9542 & 0.8587 & 0.9883 & 0.8894 & 1.0000 & 0.8999 \\ 0.8099 & 0.8999 & 0.8587 & 0.9542 & 0.8894 & 0.9883 & 0.8999 & 1.0000 \end{bmatrix}$$

TABLE 5-continued

ULA MIMO correlation matrices for high correlation

4 × 4 case $$R_{high} = \begin{bmatrix} 1.0000 & 0.9882 & 0.9541 & 0.8999 & 0.9882 & 0.9767 & 0.9430 & 0.8894 & 0.9541 & 0.9430 & 0.9105 & 0.8587 & 0.8999 & 0.8894 & 0.8587 & 0.8099 \\ 0.9882 & 1.0000 & 0.9882 & 0.9541 & 0.9767 & 0.9882 & 0.9767 & 0.9430 & 0.9430 & 0.9541 & 0.9430 & 0.9105 & 0.8894 & 0.8999 & 0.8894 & 0.8587 \\ 0.9541 & 0.9882 & 1.0000 & 0.9882 & 0.9430 & 0.9767 & 0.9882 & 0.9767 & 0.9105 & 0.9430 & 0.9541 & 0.9430 & 0.8587 & 0.8894 & 0.8999 & 0.8894 \\ 0.8999 & 0.9541 & 0.9882 & 1.0000 & 0.8894 & 0.9430 & 0.9767 & 0.9882 & 0.8587 & 0.9105 & 0.9430 & 0.9541 & 0.8099 & 0.8587 & 0.8894 & 0.8999 \\ 0.9882 & 0.9767 & 0.9430 & 0.8894 & 1.0000 & 0.9882 & 0.9541 & 0.8999 & 0.9882 & 0.9767 & 0.9430 & 0.8894 & 0.9541 & 0.9430 & 0.9105 & 0.8587 \\ 0.9767 & 0.9882 & 0.9767 & 0.9430 & 0.9882 & 1.0000 & 0.9882 & 0.9541 & 0.9767 & 0.9882 & 0.9767 & 0.9430 & 0.9430 & 0.9541 & 0.9430 & 0.9105 \\ 0.9430 & 0.9767 & 0.9882 & 0.9767 & 0.9541 & 0.9882 & 1.0000 & 0.9882 & 0.9430 & 0.9767 & 0.9882 & 0.9767 & 0.9105 & 0.9430 & 0.9541 & 0.9430 \\ 0.8894 & 0.9430 & 0.9767 & 0.9882 & 0.8999 & 0.9541 & 0.9882 & 1.0000 & 0.8894 & 0.9430 & 0.9767 & 0.9882 & 0.8587 & 0.9105 & 0.9430 & 0.9541 \\ 0.9541 & 0.9430 & 0.9105 & 0.8587 & 0.9882 & 0.9767 & 0.9430 & 0.8894 & 1.0000 & 0.9882 & 0.9541 & 0.8999 & 0.9882 & 0.9767 & 0.9430 & 0.8894 \\ 0.9430 & 0.9541 & 0.9430 & 0.9105 & 0.9767 & 0.9882 & 0.9767 & 0.9430 & 0.9882 & 1.0000 & 0.9882 & 0.9541 & 0.9767 & 0.9882 & 0.9767 & 0.9430 \\ 0.9405 & 0.9430 & 0.9541 & 0.9430 & 0.9430 & 0.9767 & 0.9882 & 0.9767 & 0.9541 & 0.9882 & 1.0000 & 0.9882 & 0.9430 & 0.9767 & 0.9882 & 0.9767 \\ 0.8587 & 0.9105 & 0.9430 & 0.9541 & 0.8894 & 0.9430 & 0.9767 & 0.9882 & 0.8999 & 0.9541 & 0.9882 & 1.0000 & 0.8894 & 0.9430 & 0.9767 & 0.9882 \\ 0.8999 & 0.8894 & 0.8587 & 0.8099 & 0.9541 & 0.9430 & 0.9105 & 0.8587 & 0.9882 & 0.9767 & 0.9430 & 0.8894 & 1.0000 & 0.9882 & 0.9541 & 0.8999 \\ 0.8894 & 0.8999 & 0.8894 & 0.8587 & 0.9430 & 0.9541 & 0.9430 & 0.9105 & 0.9767 & 0.9882 & 0.9767 & 0.9430 & 0.9882 & 1.0000 & 0.9882 & 0.9541 \\ 0.8587 & 0.8894 & 0.8999 & 0.8894 & 0.9105 & 0.9430 & 0.9541 & 0.9430 & 0.9430 & 0.9767 & 0.9882 & 0.9767 & 0.9541 & 0.9882 & 1.0000 & 0.9882 \\ 0.8099 & 0.8587 & 0.8894 & 0.8999 & 0.587 & 0.9105 & 0.9430 & 0.9541 & 0.8894 & 0.9430 & 0.9767 & 0.9882 & 0.8999 & 0.9541 & 0.9882 & 1.0000 \end{bmatrix}$$

The same method is used to adjust the 4×4 medium correlation matrix in Table 6 to insure the correlation matrix is positive semi-definite after round-off to 4 digit precision with a=0.00012.

TABLE 6

ULA MIMO correlation matrices for medium correlation

1 × 2 case N/A

2 × 2 case $$R_{medium} = \begin{pmatrix} 1 & 0.9 & 0.3 & 0.27 \\ 0.9 & 1 & 0.27 & 0.3 \\ 0.3 & 0.27 & 1 & 0.9 \\ 0.27 & 0.3 & 0.9 & 1 \end{pmatrix}$$

4 × 2 case $$R_{medium} = \begin{pmatrix} 1.0000 & 0.9000 & 0.8748 & 0.7873 & 0.5856 & 0.5271 & 0.3000 & 0.2700 \\ 0.9000 & 1.0000 & 0.7873 & 0.8748 & 0.5271 & 0.5856 & 0.2700 & 0.3000 \\ 0.8748 & 0.7873 & 1.0000 & 0.9000 & 0.8748 & 0.7873 & 0.5856 & 0.5271 \\ 0.7873 & 0.8748 & 0.9000 & 1.0000 & 0.7873 & 0.8748 & 0.5271 & 0.5856 \\ 0.5856 & 0.5271 & 0.8748 & 0.7873 & 1.0000 & 0.9000 & 0.8748 & 0.7873 \\ 0.5271 & 0.5856 & 0.7873 & 0.8748 & 0.9000 & 1.0000 & 0.7873 & 0.8748 \\ 0.3000 & 0.2700 & 0.5856 & 0.5271 & 0.8748 & 0.7873 & 1.0000 & 0.9000 \\ 0.2700 & 0.3000 & 0.5271 & 0.5856 & 0.7873 & 0.8748 & 0.9000 & 1.0000 \end{pmatrix}$$

TABLE 6-continued

ULA MIMO correlation matrices for medium correlation $$R_{medium} = \begin{pmatrix} 1.0000 & 0.9882 & 0.9541 & 0.8999 & 0.8747 & 0.8645 & 0.8347 & 0.7872 & 0.5855 & 0.5787 & 0.5588 & 0.5270 & 0.3000 & 0.2965 & 0.2862 & 0.2700 \\ 0.9882 & 1.0000 & 0.9882 & 0.9541 & 0.8645 & 0.8747 & 0.8645 & 0.8347 & 0.5787 & 0.5855 & 0.5787 & 0.5588 & 0.2965 & 0.3000 & 0.2965 & 0.2862 \\ 0.9541 & 0.9882 & 1.0000 & 0.9882 & 0.8347 & 0.8645 & 0.8747 & 0.8645 & 0.5588 & 0.5787 & 0.5855 & 0.5787 & 0.2862 & 0.2965 & 0.3000 & 0.2965 \\ 0.8999 & 0.9541 & 0.9882 & 1.0000 & 0.7872 & 0.8347 & 0.8645 & 0.8747 & 0.5270 & 0.5588 & 0.5787 & 0.5855 & 0.2700 & 0.2862 & 0.2965 & 0.3000 \\ 0.8747 & 0.8645 & 0.8347 & 0.7872 & 1.0000 & 0.9882 & 0.9541 & 0.8999 & 0.8747 & 0.8645 & 0.8347 & 0.7872 & 0.5855 & 0.5787 & 0.5588 & 0.5270 \\ 0.8645 & 0.8747 & 0.8645 & 0.8347 & 0.9882 & 1.0000 & 0.9882 & 0.9541 & 0.8645 & 0.8747 & 0.8645 & 0.8347 & 0.5787 & 0.5855 & 0.5787 & 0.5588 \\ 0.8347 & 0.8645 & 0.8747 & 0.8645 & 0.9541 & 0.9882 & 1.0000 & 0.9882 & 0.8347 & 0.8645 & 0.8747 & 0.8645 & 0.5588 & 0.5787 & 0.5855 & 0.5787 \\ 0.7872 & 0.8347 & 0.8645 & 0.8747 & 0.8999 & 0.9541 & 0.9882 & 1.0000 & 0.7872 & 0.8347 & 0.8645 & 0.8747 & 0.5270 & 0.5588 & 0.5787 & 0.5855 \\ 0.5855 & 0.5787 & 0.5588 & 0.5270 & 0.8747 & 0.8645 & 0.8347 & 0.7872 & 1.0000 & 0.9882 & 0.9541 & 0.8999 & 0.8747 & 0.8645 & 0.8347 & 0.7872 \\ 0.5787 & 0.5855 & 0.5787 & 0.5588 & 0.8645 & 0.8747 & 0.8645 & 0.8347 & 0.9882 & 1.0000 & 0.9882 & 0.9541 & 0.8645 & 0.8747 & 0.8645 & 0.8347 \\ 0.5588 & 0.5787 & 0.5855 & 0.5787 & 0.8347 & 0.8645 & 0.8747 & 0.8645 & 0.9541 & 0.9882 & 1.0000 & 0.9882 & 0.8347 & 0.8645 & 0.8747 & 0.8645 \\ 0.5270 & 0.5588 & 0.5787 & 0.5855 & 0.7872 & 0.8347 & 0.8645 & 0.8747 & 0.8999 & 0.9541 & 0.9882 & 1.0000 & 0.7872 & 0.8347 & 0.8645 & 0.8747 \\ 0.3000 & 0.2965 & 0.2862 & 0.2700 & 0.5855 & 0.5787 & 0.5588 & 0.5270 & 0.8747 & 0.8645 & 0.8347 & 0.7872 & 1.0000 & 0.9882 & 0.9541 & 0.8999 \\ 0.2965 & 0.3000 & 0.2965 & 0.2862 & 0.5787 & 0.5855 & 0.5787 & 0.5588 & 0.8645 & 0.8747 & 0.8645 & 0.8347 & 0.9882 & 1.0000 & 0.9882 & 0.9541 \\ 0.2862 & 0.2965 & 0.3000 & 0.2965 & 0.5588 & 0.5787 & 0.5855 & 0.5787 & 0.8347 & 0.8645 & 0.8747 & 0.8645 & 0.9541 & 0.9882 & 1.0000 & 0.9882 \\ 0.2700 & 0.2862 & 0.2965 & 0.3000 & 0.5270 & 0.5588 & 0.5787 & 0.5855 & 0.7872 & 0.8347 & 0.8645 & 0.8747 & 0.8999 & 0.9541 & 0.9882 & 1.0000 \end{pmatrix}$$

4 × 4 case

In Table 7 below, $I_d$ is the d×d identity matrix.

TABLE 7

ULA MIMO correlation matrices for low correlation

| | |
|---|---|
| 1 × 2 case | $R_{low} = I_2$ |
| 2 × 2 case | $R_{low} = I_4$ |
| 4 × 2 case | $R_{low} = I_8$ |
| 4 × 4 case | $R_{low} = I_{16}$ |

Xpol MIMO Channel Correlation

The following MIMO channel correlation matrices apply for the antenna configuration using cross polarized antennas at both eNodeB and UE. The cross-polarized antenna elements with +/−45 degrees polarization slant angles are deployed at eNB and cross-polarized antenna elements with +90/0 degrees polarization slant angles are deployed at UE. For the cross-polarized antennas, the N antennas are labelled such that antennas for one polarization are listed from 1 to N/2 and antennas for the other polarization are listed from N/2+1 to N, where N is the number of transmit or receive antennas.

The channel spatial correlation matrix is calculated according to the equation $R_{spat} = P(R_{eNB} \otimes \Gamma \otimes R_{UE}) P^T$ where $R_{UE}$ is the spatial correlation matrix at the UE with same polarization;
$R_{eNB}$ is the spatial correlation matrix at the eNB with same polarization;
$\Gamma$ is a polarization correlation matrix; and
$(\bullet)^T$ denotes a matrix transpose operation.

The matrix $\Gamma$ is defined as $$\Gamma = \begin{bmatrix} 1 & 0 & -\gamma & 0 \\ 0 & 1 & 0 & \gamma \\ -\gamma & 0 & 1 & 0 \\ 0 & \gamma & 0 & 1 \end{bmatrix}$$

Elements of a permutation matrix P are defined as $$P(a, b) = \begin{cases} 1 & \text{for } a = (j-1)Nr + i \text{ and } b = 2(j-1)Nr + i, \\ & i = 1, \ldots, Nr, j = 1, \ldots Nt/2 \\ 1 & \text{for } a = (j-1)Nr + i \text{ and } b = 2(j-Nt/2)Nr - Nr + i, \\ & i = 1, \ldots, Nr, j = Nt/2 + 1, \ldots, Nt \\ 0 & \text{otherwise} \end{cases}$$

where $N_t$ and $N_r$ are the number of transmitter and receiver respectively. This is used to map the spatial correlation coefficients in accordance with the antenna element labelling system.

For a 2-antenna transmitter using one pair of cross-polarized antenna elements, $R_{eNB}=1$.

For a 4-antenna transmitter using two pairs of cross-polarized antenna elements, $$R_{eNB} = \begin{pmatrix} 1 & \alpha \\ \alpha^* & 1 \end{pmatrix}.$$

For an 8-antenna transmitter using four pairs of cross-polarized antenna elements, $$R_{eNB} = \begin{pmatrix} 1 & \alpha^{1/9} & \alpha^{4/9} & \alpha \\ \alpha^{1/9*} & 1 & \alpha^{1/9} & \alpha^{4/9} \\ \alpha^{4/9*} & \alpha^{1/9*} & 1 & \alpha^{1/9} \\ \alpha^* & \alpha^{4/9*} & \alpha^{1/9*} & 1 \end{pmatrix}.$$

The values for parameters $\alpha$, $\beta$ and $\gamma$ for high spatial correlation are given in Table 8.

TABLE 8

Xpol correlation parameters for high correlation
High spatial correlation

| a | β | γ |
|---|---|---|
| 0.9 | 0.9 | 0.3 |

Note 1:
Value of α applies when more than one pair of cross-polarized antenna elements at eNB side.
Note 2:
Value of β applies when more than one pair of cross-polarized antenna elements at UE side.

The correlation matrices for high spatial correlation are defined in Table 9 below. The values in Table 9 have been adjusted to insure the correlation matrix is positive semi-definite after round-off to 4 digit precision. This is done using the equation $R_{high}=[R_{spat}+aI_n]/(1+a)$ where the value "a" is a scaling factor such that the smallest value is used to obtain a positive semi-definite result. For the 8×2 high spatial correlation case, a=0.00010.

TABLE 9

Xpol MIMO correlation matrices for 8 × 2 high spatial correlation

8 × 2 case $R_{high} =$

| 1.0000 | 0.0000 | 0.9883 | 0.0000 | 0.9542 | 0.0000 | 0.8999 | 0.0000 | −0.3000 | 0.0000 | −0.2965 | 0.0000 | −0.2862 | 0.0000 | −0.2700 | 0.0000 |
|---|---|---|---|---|---|---|---|---|---|---|---|---|---|---|---|
| 0.0000 | 1.0000 | 0.0000 | 0.9883 | 0.0000 | 0.9542 | 0.0000 | 0.8999 | 0.0000 | 0.3000 | 0.0000 | 0.2965 | 0.0000 | 0.2862 | 0.0000 | 0.2700 |
| 0.9883 | 0.0000 | 1.0000 | 0.0000 | 0.9883 | 0.0000 | 0.9542 | 0.0000 | −0.2965 | 0.0000 | −0.3000 | 0.0000 | −0.2965 | 0.0000 | −0.2862 | 0.0000 |
| 0.0000 | 0.9883 | 0.0000 | 1.0000 | 0.0000 | 0.9883 | 0.0000 | 0.9542 | 0.0000 | 0.2965 | 0.0000 | 0.3000 | 0.0000 | 0.2965 | 0.0000 | 0.2862 |
| 0.9542 | 0.0000 | 0.9883 | 0.0000 | 1.0000 | 0.0000 | 0.9883 | 0.0000 | −0.2862 | 0.0000 | −0.2965 | 0.0000 | −0.3000 | 0.0000 | −0.2965 | 0.0000 |
| 0.0000 | 0.9542 | 0.0000 | 0.9883 | 0.0000 | 1.0000 | 0.0000 | 0.9883 | 0.0000 | 0.2862 | 0.0000 | 0.2965 | 0.0000 | 0.3000 | 0.0000 | 0.2965 |
| 0.8999 | 0.0000 | 0.9542 | 0.0000 | 0.9883 | 0.0000 | 1.0000 | 0.0000 | −0.2700 | 0.0000 | −0.2862 | 0.0000 | −0.2965 | 0.0000 | −0.3000 | 0.0000 |
| 0.0000 | 0.8999 | 0.0000 | 0.9542 | 0.0000 | 0.9883 | 0.0000 | 1.0000 | 0.0000 | 0.2700 | 0.0000 | 0.2862 | 0.0000 | 0.2965 | 0.0000 | 0.3000 |
| −0.3000 | 0.0000 | −0.2965 | 0.0000 | −0.2862 | 0.0000 | −0.2700 | 0.0000 | 1.0000 | 0.0000 | 0.9883 | 0.0000 | 0.9542 | 0.0000 | 0.8999 | 0.0000 |
| 0.0000 | 0.3000 | 0.0000 | 0.2965 | 0.0000 | 0.2862 | 0.0000 | 0.2700 | 0.0000 | 1.0000 | 0.0000 | 0.9883 | 0.0000 | 0.9542 | 0.0000 | 0.8999 |
| −0.2965 | 0.0000 | −0.3000 | 0.0000 | −0.2965 | 0.0000 | −0.2862 | 0.0000 | 0.9883 | 0.0000 | 1.0000 | 0.0000 | 0.9883 | 0.0000 | 0.9542 | 0.0000 |
| 0.0000 | 0.2965 | 0.0000 | 0.3000 | 0.0000 | 0.2965 | 0.0000 | 0.2862 | 0.0000 | 0.9883 | 0.0000 | 1.0000 | 0.0000 | 0.9883 | 0.0000 | 0.9542 |
| −0.2862 | 0.0000 | −0.2965 | 0.0000 | −0.3000 | 0.0000 | −0.2965 | 0.0000 | 0.9542 | 0.0000 | 0.9883 | 0.0000 | 1.0000 | 0.0000 | 0.9883 | 0.0000 |
| 0.0000 | 0.2862 | 0.0000 | 0.2965 | 0.0000 | 0.3000 | 0.0000 | 0.2965 | 0.0000 | 0.9542 | 0.0000 | 0.9883 | 0.0000 | 1.0000 | 0.0000 | 0.9883 |
| −0.2700 | 0.0000 | −0.2862 | 0.0000 | −0.2965 | 0.0000 | −0.3000 | 0.0000 | 0.8999 | 0.0000 | 0.9542 | 0.0000 | 0.9883 | 0.0000 | 1.0000 | 0.0000 |
| 0.0000 | 0.2700 | 0.0000 | 0.2862 | 0.0000 | 0.2965 | 0.0000 | 0.3000 | 0.0000 | 0.8999 | 0.0000 | 0.9542 | 0.0000 | 0.9883 | 0.0000 | 1.0000 |

Simulation Results with 4-Rx AP

Figure 3A:
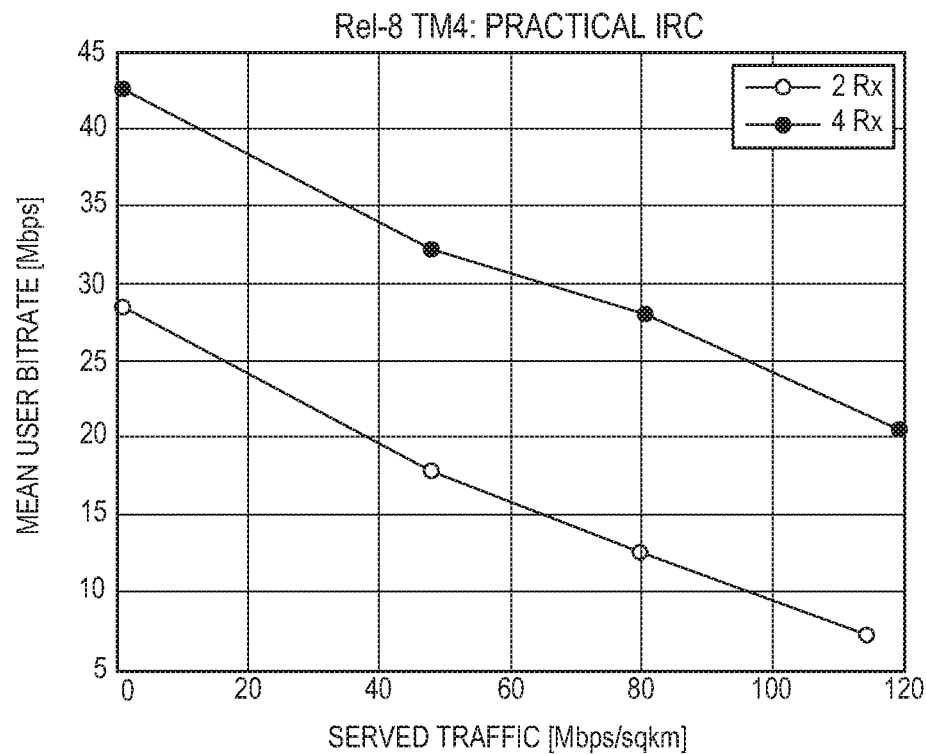
FIG. 3A is a graph depicting system level throughput performance for the mean user bit rate for TM4.
Figure 3B:
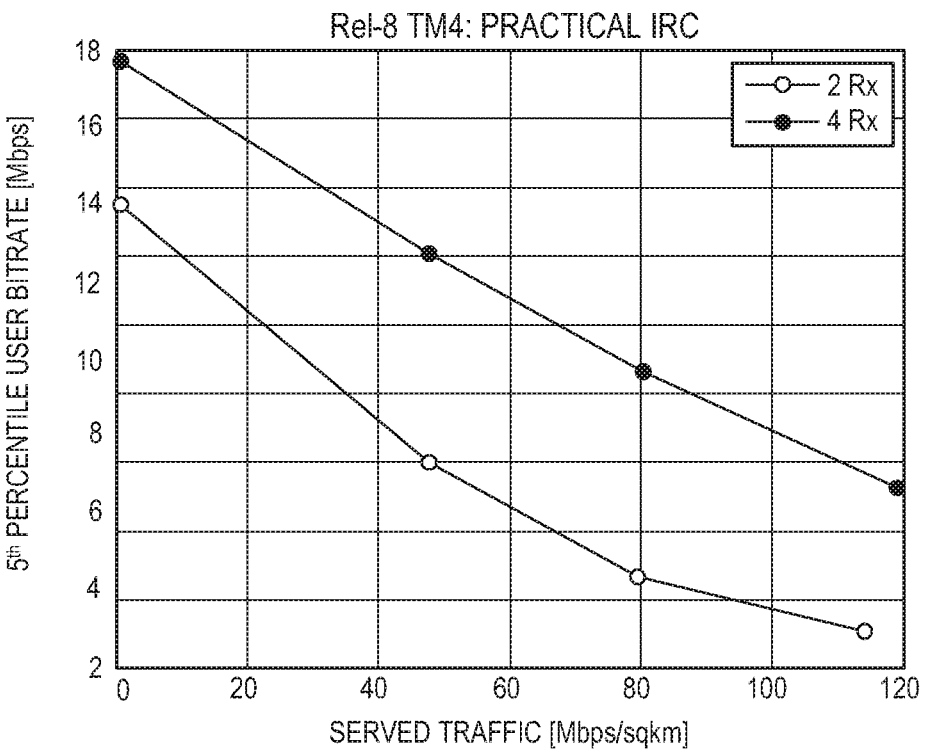
FIG. 3B is a graph depicting system level throughput performance for 5% percentile cell edge user bit rate for TM4.

With MIMO system with a 4-receiver antenna (4-Rx) access point (AP), the performance is improved in a straightforward way. FIG. 3A depicts the system level throughput performance for the mean user bit rate for Transmission Mode (TM) 4. FIG. 3B depicts the system level throughput performance for a $5^{th}$ percentile cell edge user bit rate for TM4. With two layers and TM4, the system level performance of 4-Rx is boosted by 200% throughput at medium served traffic (60 Mbps/sqkm) for both mean and $5^{th}$ percentile user bit rate.

Figure 4A:
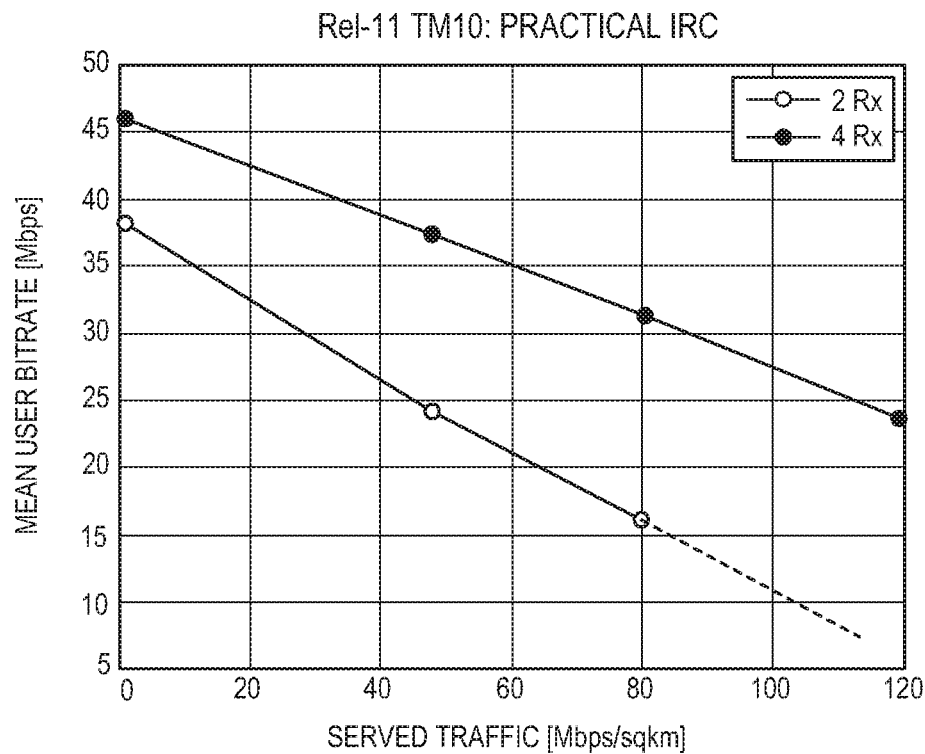
FIG. 4A is a graph depicting system level throughput performance for the mean user bit rate for TM10.
Figure 4B:
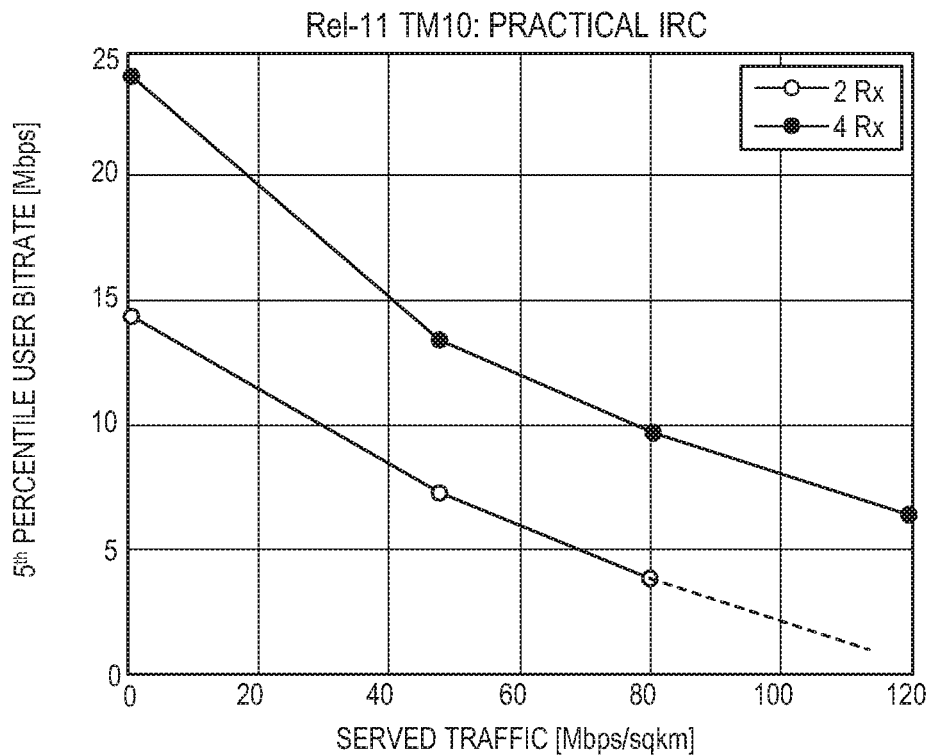
FIG. 4B is a graph depicting system level throughput performance for 5% percentile cell edge user bit rate for TM10.

FIGS. 4A and 4B depict the system level throughput performance for the mean user bit rate and $5^{th}$ percentile cell edge user bit rate, respectively, for TM10. For TM10 and two layers, the system level performance of 4-Rx is boosted by 166% throughput for mean user bit rate (FIG. 4A) and by 200% throughput for $5^{th}$ percentile user bit rate (FIG. 4B) at medium served traffic (60 Mbps/sqkm).

Link Level Gains with 4-Rx

The link level results are based on low channel correlation between antennas. The link level results in FIGS. 5 and 6 under multi-cell scenarios are based on the Interference Reduction Combining (IRC) scenario with TM4 on the serving cell and two interfering cells. Fixed Reference Channel (FRC) and followed Channel Quality Indicator (CQI) are used respectively in FIGS. 5 and 6 using practical Minimum Mean Square Error (MMSE) Maximum Ratio Combining (MRC) or MMSE-IRC receivers.

Figure 5A:
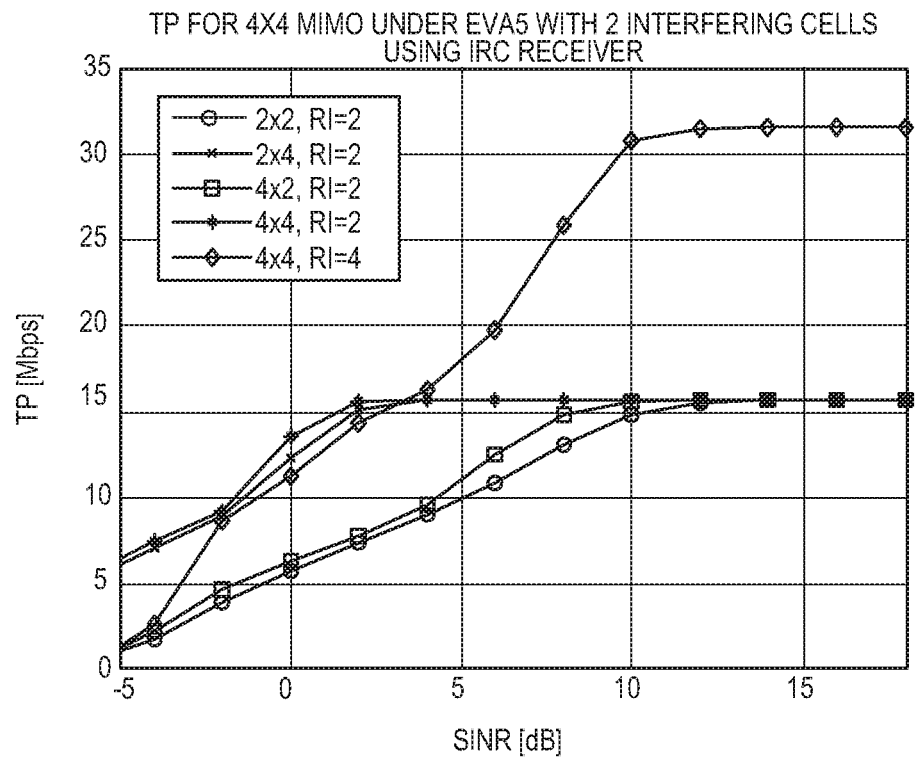
FIG. 5A is a graph depicting system level throughput for 4×4 MIMO under EVA5 with two interfering cells, using an IRC receiver with TM4 with FRC 16QAM code rate 1/2 under multi-cell scenario.
Figure 5B:
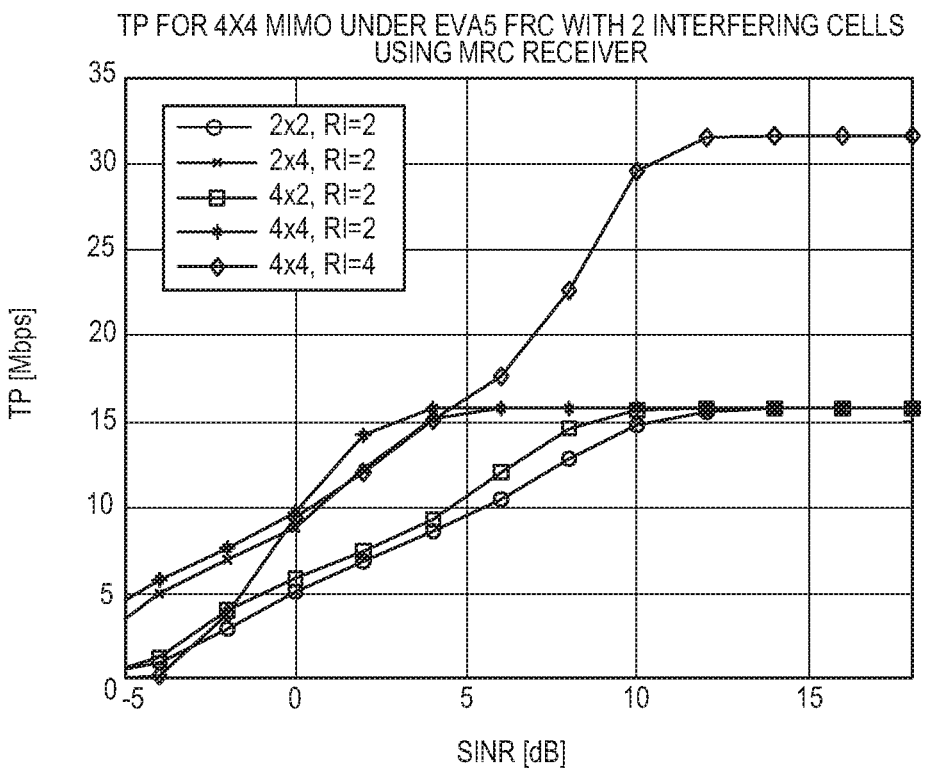
FIG. 5B is a graph depicting system level throughput for 4×4 MIMO under EVA5 with two interfering cells, using an MRC receiver with TM4 with FRC 16QAM code rate 1/2 under multi-cell scenario.

FIG. 5A depicts throughput for 4×4 MIMO under EVA5 with two interfering cells, using an IRC receiver. FIG. 5B depicts throughput for 4×4 MIMO under EVA5 with two interfering cells, using an MRC receiver. Both cases depict TM4 with FRC 16QAM code rate ½ under multi-cell scenario, based on practical IRC (FIG. 5A) or MRC (FIG. 5B) receiver.

Figure 6A:
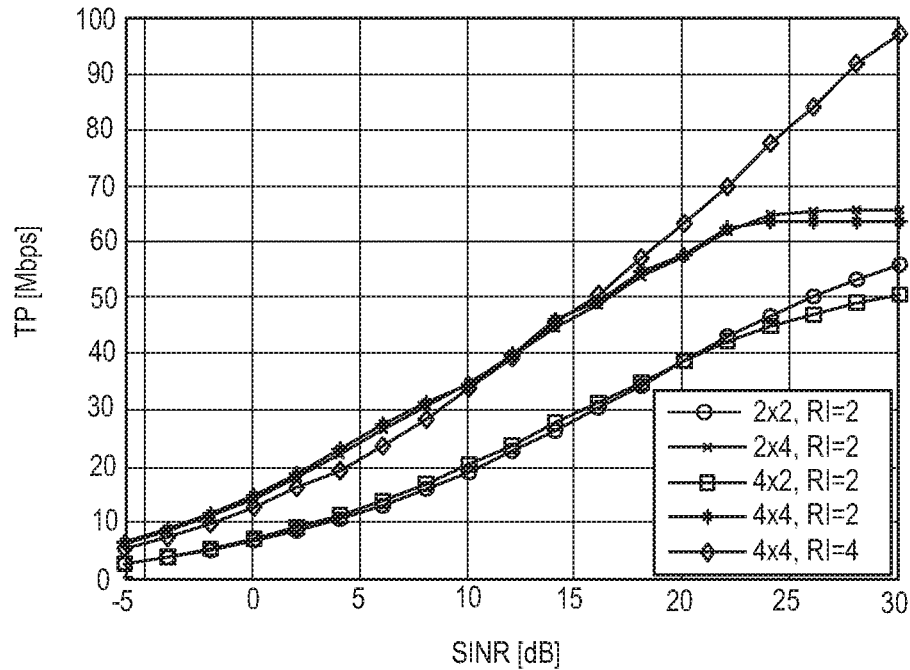
FIG. 6A is a graph depicting system level throughput for 4×4 MIMO under EVA5 with two interfering cells, using an IRC receiver with TM4 with followed CQI under multi-cell scenario.
Figure 6B:
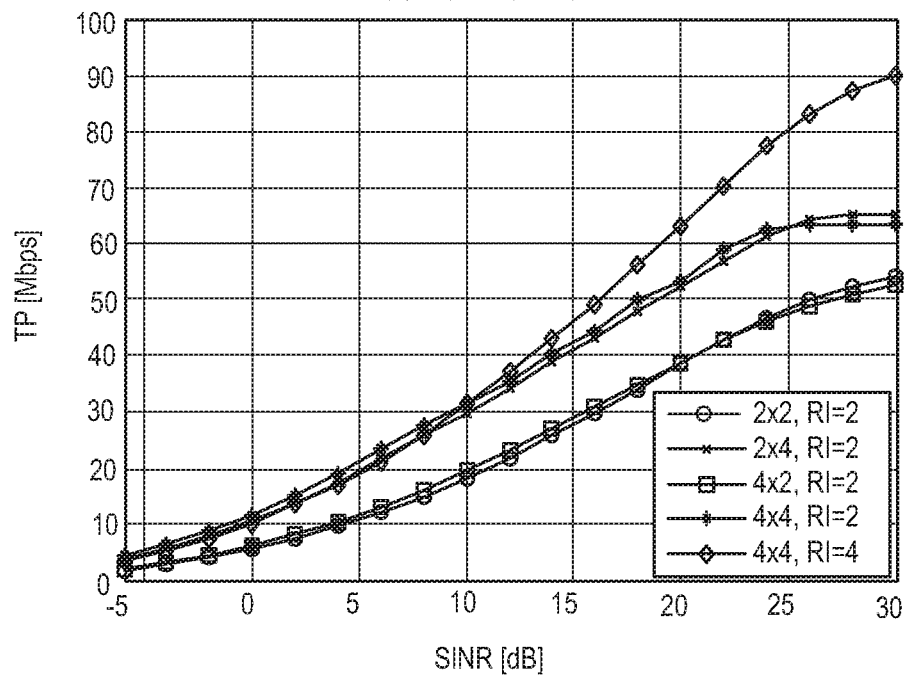
FIG. 6B is a graph depicting system level throughput for 4×4 MIMO under EVA5 with two interfering cells, using an MRC receiver with TM4 with followed CQI under multi-cell scenario.

FIG. 6A depicts throughput for 4×4 MIMO under EVA5 with two interfering cells, using an IRC receiver. FIG. 6B depicts throughput for 4×4 MIMO under EVA5 with two interfering cells, using an MRC receiver. Both cases depict TM4 with followed CQI under multi-cell scenario, based on practical IRC (FIG. 6A) or MRC (FIG. 6B) receiver.

These graphs show that even with two layers on 4-Rx with diversity gain, only the link level performance can be improved substantially: by 5 dB for an MMSE-MRC receiver and by 7 dB for an MMSE-IRC receiver. With full rank as four layers with 4-Rx, the peak throughput is boosted to double, compared to two layers with 2-Rx at high SINR range.

Figure 7A:
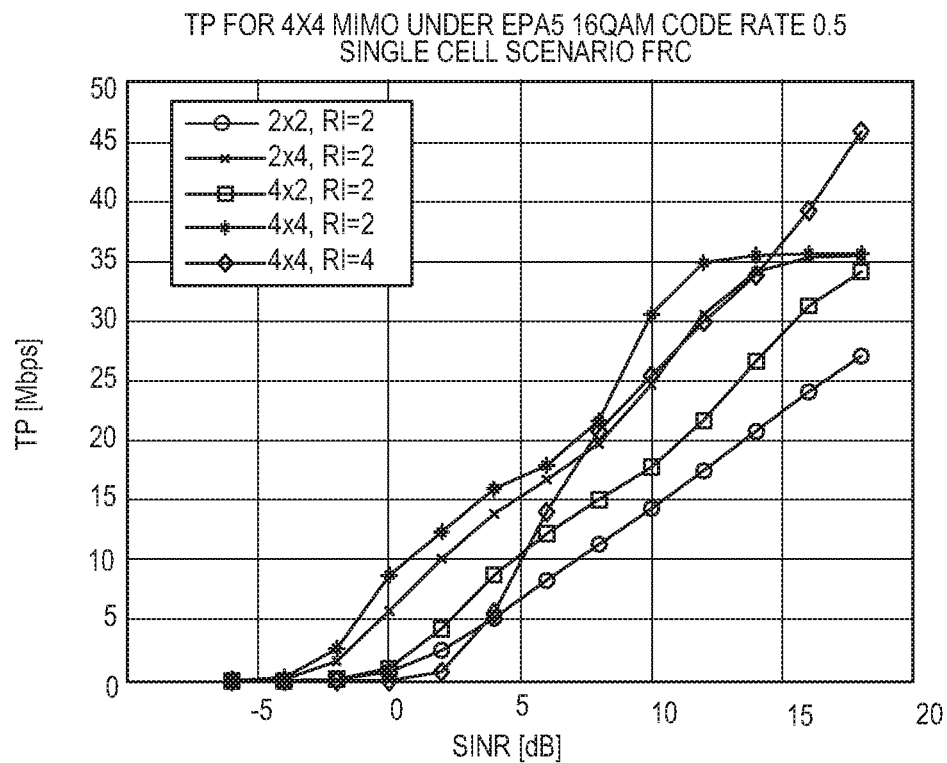
FIG. 7A is a graph depicting the link level results for single-cell scenario with TM4 based on FRC.
Figure 7B:
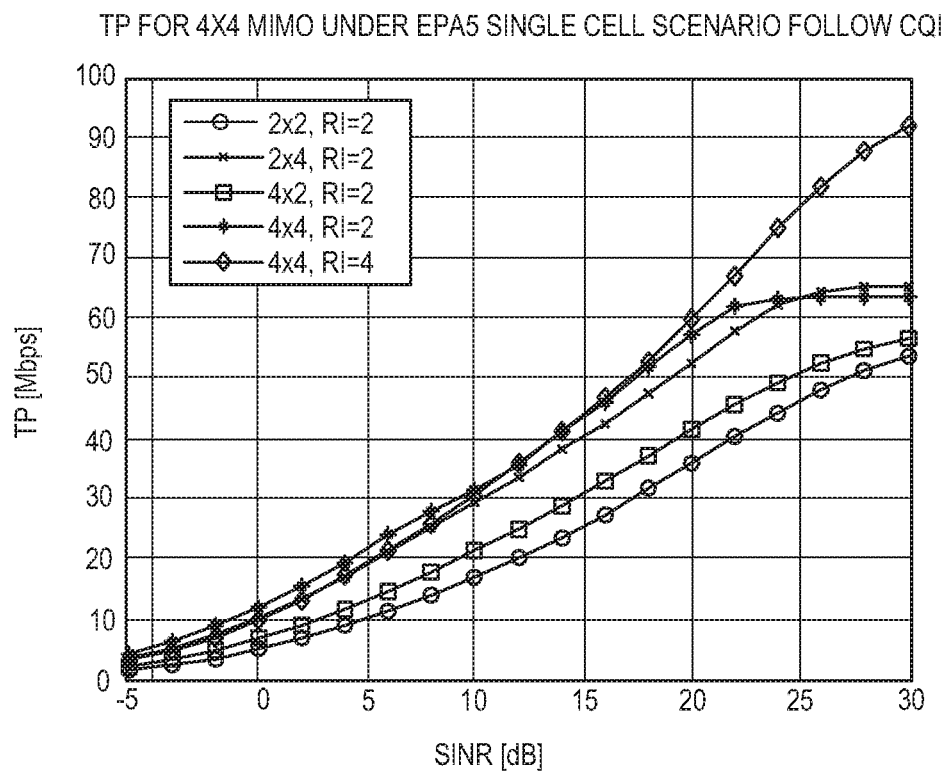
FIG. 7B is a graph depicting the link level results for single-cell scenario with TM4 based on followed CQI.

FIG. 7A depicts the link level results for single-cell scenario with TM4 based on FRC; FIG. 7B depicts the same with followed CQI. With FRC test, the results for four layers are worse than two layers at low SNR range. This is due to the fact that there is no link adaption, and hence a forced too-high modulation and coding scheme (MCS) on what the channel can support. For 4-Rx antennas with 2 layers, the diversity gain can still achieve up to 5 dB.

Figure 8:
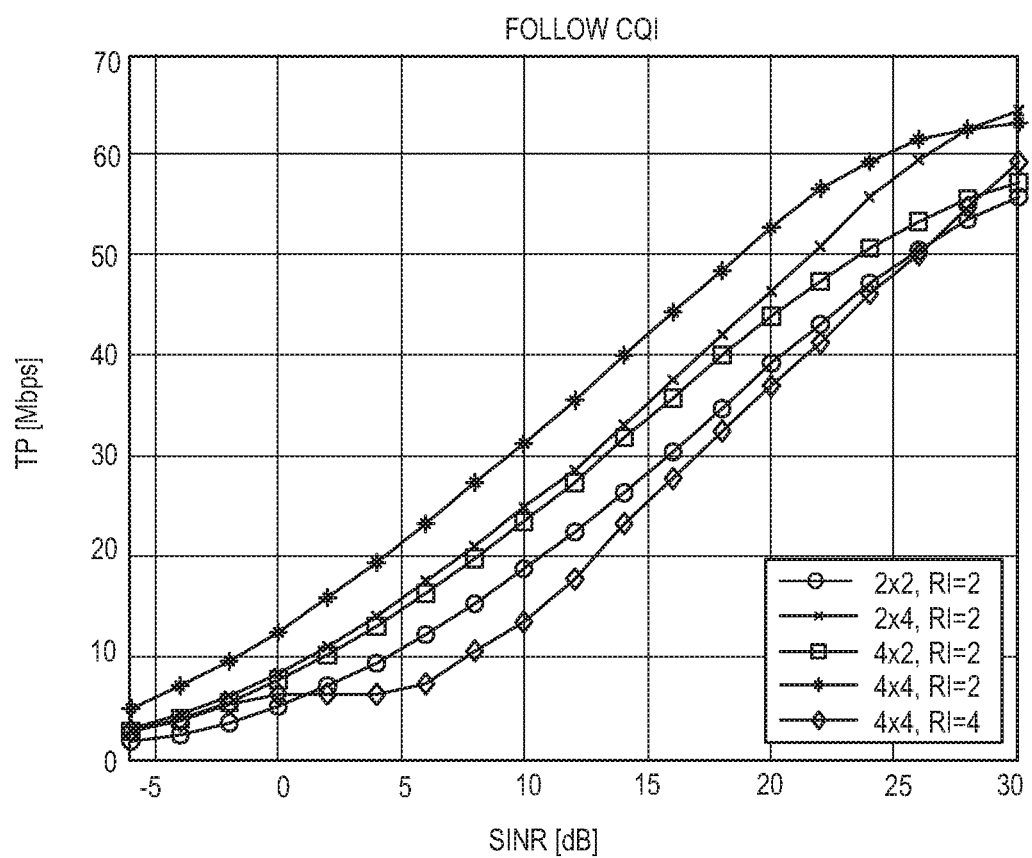
FIG. 8 is a graph depicting the link level throughput for single-cell scenario for a liner MMSE receiver with follow CQI under Xpol high on antenna configuration.
Figure 9A:
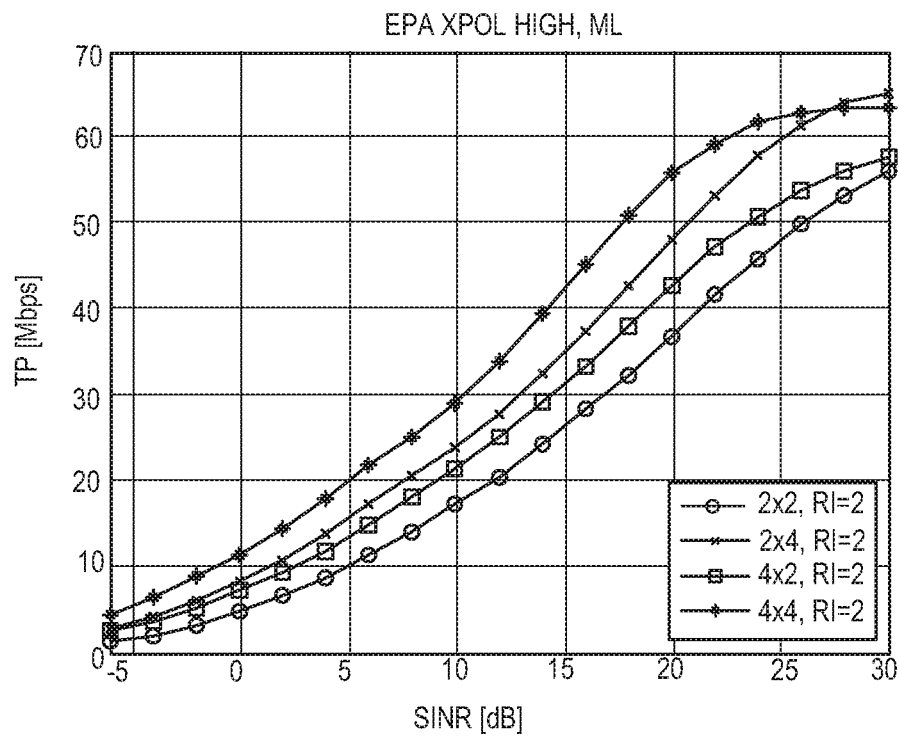
FIG. 9A is a graph depicting the link level throughput for single-cell scenario for a SU-MIMO IC receiver as ML with follow CQI under Xpol high on antenna configuration.
Figure 9B:
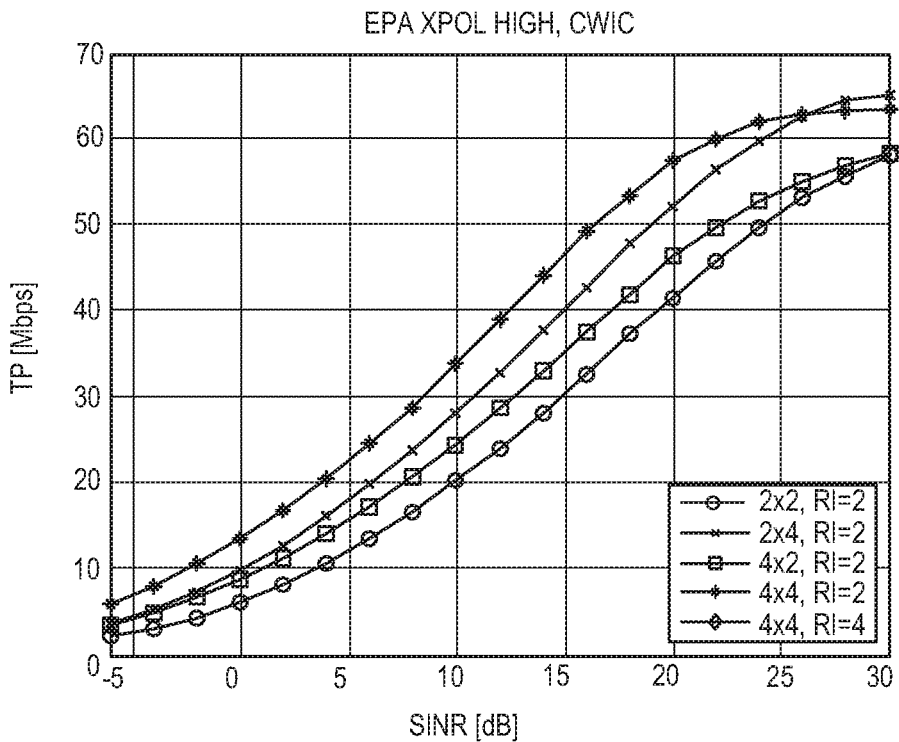
FIG. 9B is a graph depicting the link level throughput for single-cell scenario for a SU-MIMO IC receiver as CWIC with follow CQI under Xpol high on antenna configuration.

FIGS. 8 and 9A-B depict the link level throughput results for single-cell scenario for different receivers with follow CQI under Xpol high on antenna configuration. FIG. 8 depicts the results for a liner MMSE receiver; FIG. 9A is for SU-MIMO interference cancellation (IC) receivers as maximum likelihood (ML); and FIG. 9B is for SU-MIMO IC receivers as codeword IC (CWIC). In FIG. 8, 4×4 with four layers is included, but it gives worse performance than two layer cases. This is due to high correlations between two sets of Xpol antennas, so only two of the four layers are actually good enough to demodulate the data. However, there are still good gain for 4-Rx AP with two layers up to 5 dB observed, compared to 2-Rx AP with two layers.

Measurement of MIMO Antenna Correlations

As the above discussion, Tables 1-9, and FIGS. 1-9 demonstrate, different antenna configurations, with different correlations among Rx antennas on the UE side, can result in significant differences in UE performance. Hence, the measurement of MIMO antenna correlations is important. Several ways of measuring this are known in the art. For example, one known method is two-stage MIMO over-the-air (OTA), which is described in detail in 3GPP TR 37.977, v12.1.0, the disclosure of which is incorporated herein by reference in its entirety.

The two-stage MIMO OTA method is based on the assumption that the far-field antenna radiation pattern will contain all the necessary information for evaluation of the antenna's performance, such as radiation power, efficiency, and correlation. The method also assumes that with channel model approaches, the influence of antenna radiation patterns can be correctly incorporated into the channel model. Thus, the method will first measure the MIMO antenna patterns, and then incorporate the measurement antenna patterns with chosen MIMO OTA channel models for real-time emulation.

The assumption of the two-stage MIMO OTA method is that the measured far field antenna pattern of the multiple antennas can fully capture the mutual coupling of the multiple antenna arrays and their influence.

In a first stage, a multiple-antennas system is tested in a traditional anechoic chamber. The chamber for antenna pattern measurement is set up, where the device under test (DUT) is put into a chamber and the far zone pattern for each antenna element is measured. The influence of human body loss can be measured by attaching the DUT to a specific anthropomorphic mannequin (SAM) head and or hand when doing the antenna pattern measurements. The DUT is placed against a SAM phantom. The chamber is equipped with a positioner, which makes it possible to perform full 3-D far zone pattern measurements for both Tx and Rx radiated performance. The measurement antenna should be able to measure two orthogonal polarizations.

In a second stage of the measurement, the antenna patterns measured in the first stage are combined into a MIMO channel model, the MIMO channel model is emulated with the measured antenna patterns incorporated in the commercial channel emulator, and the OTA test is performed in a conducted or a calibrated radiated approach.

Figure 10:
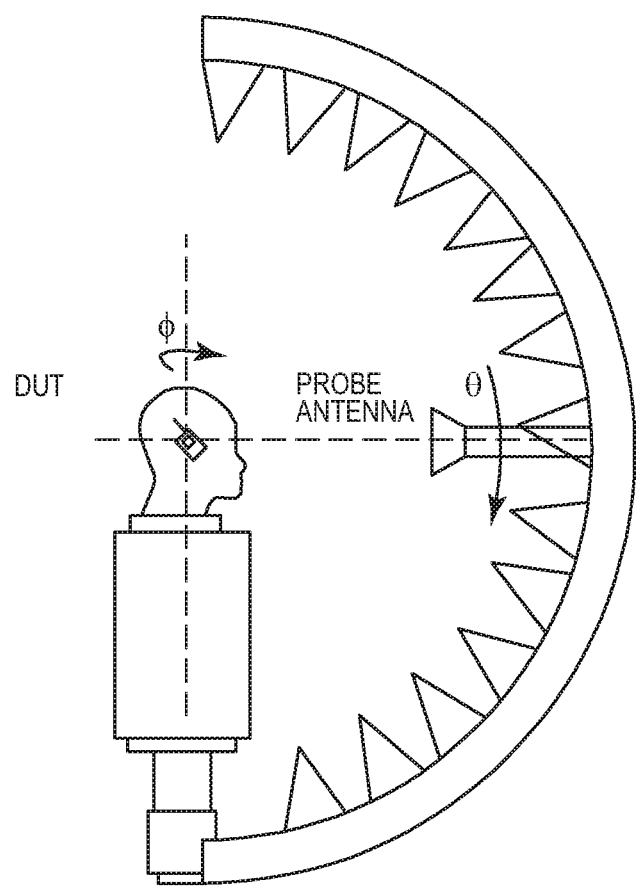
FIG. 10 is a block diagram depicting the coordinate system used in anechoic chamber antenna correlation measurements.
Figure 11:
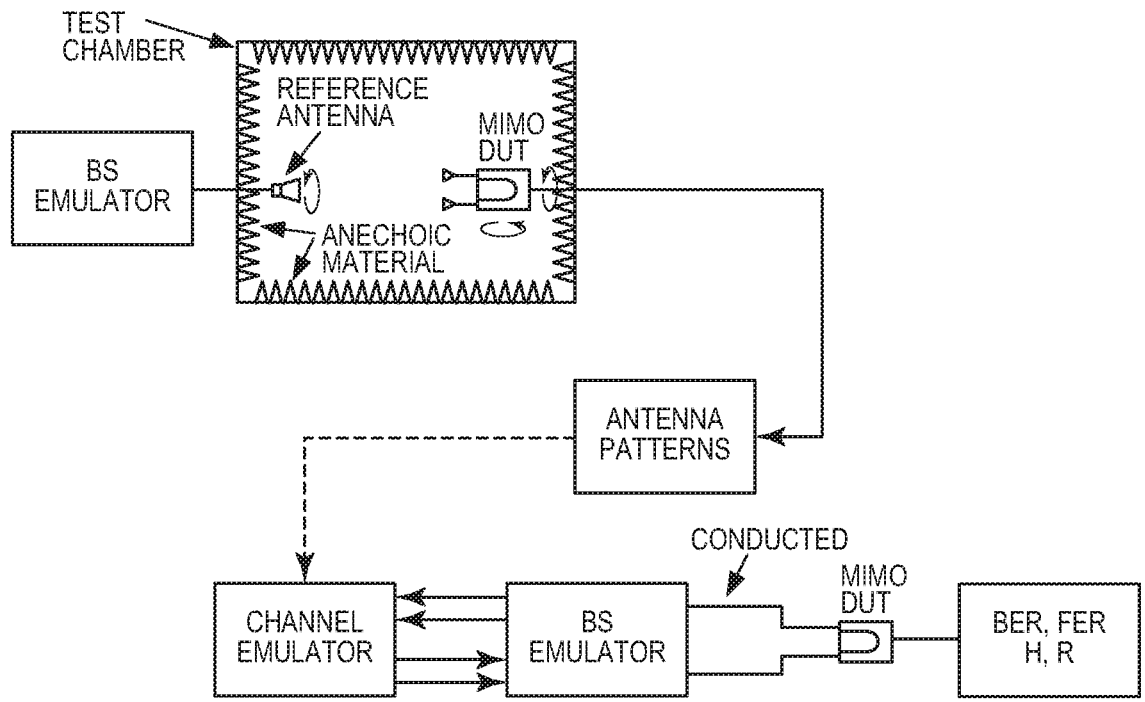
FIG. 11 is a block diagram depicting test equipment set-up for a two-stage MIMO OTA test.
Figure 12:
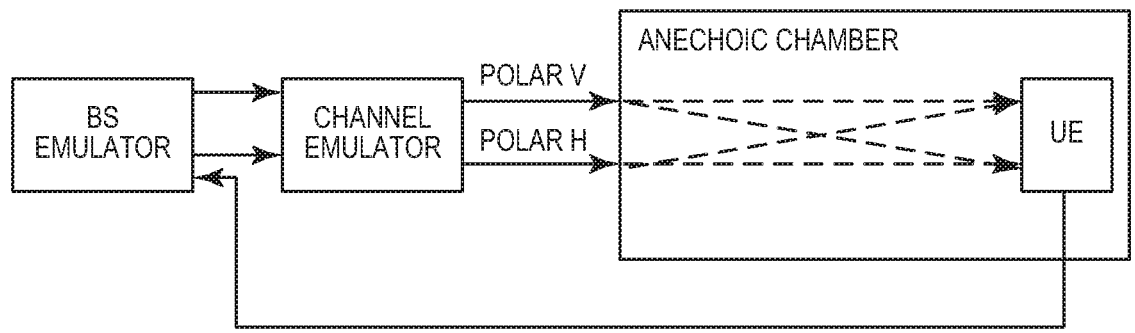
FIG. 12 depicts a fully radiated two-stage test set-up.

FIG. 10 depicts the coordinate system used in these measurements; FIG. 11 depicts the overall test equipment set-up for conducted connection mode; and FIG. 12 depicts the radiated connection mode. The integrated channel model, with both MIMO antenna effect and the multipath channel effect, can be emulated with a commercial MIMO channel emulator. As depicted in FIG. 11, the base station emulator is connected to the MIMO channel emulator and then to the MIMO device's temporary antenna ports via approved RF cables. These ports are the standard ones provided for conducted conformance tests. An alternative to using a conducted connection is to use a calibrated radiated connection in an anechoic environment, as depicted in FIG. 12. This technique exploits the Eigen modes of the transmission channel to provide independent radiated connections between the probe antennas and each receiver after the antenna. By controlling the power settings of the channel emulator and also the integrated channel model, the end-to-end throughput with the MIMO antenna radiation influence can be measured using either connection method. The radiated connection method intrinsically includes the effects of equipment-under-test (EUT) self-interference.

There are two different approaches to combine the antenna patterns with MIMO channel model. First, one can apply antenna patterns to Ray-based channel models. Ray-based models are capable of supporting arbitrary antenna patterns under predefined channel modes in a natural way, as described above. If a Ray-based model like spatial channel model (SCM) model is specified to be used for MIMO OTA test, then the channel emulator must be able to support SCM channel model emulation and support loading measured antenna patterns.

In a second approach, one can apply antenna patterns to correlation-based channel models. With a correlation matrix calculation method for arbitrary antenna patterns under multipath channel conditions, the correlation matrix and the antenna imbalance can be calculated and then emulated by the channel emulator.

This method can be used to measure numerous figures of merit, including: throughput; total radiated power (TRP) and total radiated sensitivity (TRS); CQI and block error rate (BLER); antenna efficiency and MEG; and antenna correlation and MIMO channel capacity. The coupling between the UE antenna and internal spurious emission of the UE might be characterized during the antenna pattern measurement stage inside the chamber by lowering the signal power—this is an area for further research.

FIG. 12 depicts the fully radiated two-stage test setup. Two probe antennas with polarization vertical (V) and horizontal (H) are co-located in the anechoic chamber. The only change from the conducted second stage is to replace the RF cables with the radiated channel inside the chamber. Due to the propagation channel in the chamber, signals transmitted from each probe antenna are received by both UE antennas, which is different from the cable conducted case where the signals are isolated. However, by precoding the transmitted signals using spatial multiplexing techniques, it is possible—by calculating the radiated channel matrix and by applying its inverse to the transmitted signals—to create an identity matrix allowing the transmitted signals to be received independently at each receiver after the antenna, thus recreating the cable conducted situation but with radiated self-interference now included.

Assume $x_1$ and $x_2$ are the transmitted signals from the base station emulator, after applying the desired multipath fading channel and convolving with the complex antenna pattern we get $f(x_1)$ and $f(x_2)$. The radiated channel matrix between the probe antennas and the UE antennas is $$= \begin{pmatrix} h_{11} & h_{12} \\ h_{21} & h_{22} \end{pmatrix}.$$

If the channel emulator applies the inverse of the radiated channel matrix $$H^{-1} = \begin{pmatrix} \alpha & \beta \\ \gamma & \delta \end{pmatrix}$$

to $f(x_1)$ and $f(x_2)$, the signal received at the UE antennas is same as the cable-conducted method as follows:

$$\begin{pmatrix} \gamma_1 \\ \gamma_2 \end{pmatrix} = \begin{pmatrix} h_{11} & h_{12} \\ h_{21} & h_{22} \end{pmatrix} \begin{pmatrix} \alpha & \beta \\ \gamma & \delta \end{pmatrix} \begin{pmatrix} f(x_1) \\ f(x_2) \end{pmatrix} = \begin{pmatrix} 1 & 0 \\ 0 & 1 \end{pmatrix} \begin{pmatrix} f(x_1) \\ f(x_2) \end{pmatrix} = \begin{pmatrix} f(x_1) \\ f(x_2) \end{pmatrix}$$

Another alternative is, instead of using a channel emulator, the correlation can be obtained by using known signals in a live network, and hence the correlation can be measured continuously and under different radio conditions. The known signal in a LTE system can for example be: Cell-specific Reference Signal (CRS), Synchronization signal, or Demodulation Reference Signal (DMRS).

Performance Deficiency Based on Lack of UE Antenna Information at the Base Station When the UE has multiple Rx antennas, the network node (e.g., Node B in HSPA or eNode B in LTE) can utilize the high rank transmission, but under some bands, depending on the MIMO antenna configuration, the correlation from the UE side could be different than under other bands. For example, for high band the MIMO channel correlation is lower than that from low band, which brings uncertainty based on using the same assumption for the reported CSI including CQI, PMI, RI. If the network node does not have the information about the MIMO channel antenna configuration status, the system performance will be decreased by such uncertainty from the CSI reporting.

Hence, the network should ideally know which type of antenna(s) are deployed on a UE, to optimize signal processing and transmission parameters. Additionally, knowledge of the correlations among different Rx antennas can be utilized to improve performance. Other receiver antenna parameters of interest for a given UE include the number of antennas, the different frequency bands used, and the power imbalance among the receiver antennas.

These parameters may vary over time, such as for example in dependence on the frequency band. For example, antennas designed for higher frequencies are smaller; hence space constraints may only allow for some antennas to be operative in high bands. Additionally, a UE may change the number of active antennas, or other MIMO antenna parameters, in response to available battery power, or when entering or leaving a mode that requires either large peak throughput or higher received signal power. Furthermore, antenna correlation and/or power imbalance may change in response to positioning of a user's head, hands, or the like, or in response to changes in atmospheric conditions (e.g., humidity).

The possible differences over time in UE antenna parameter values introduce uncertainty if static assumptions are used at the network in interpreting the reported Channel State Information (CSI). This uncertainty impairs system performance.

Figure 13:
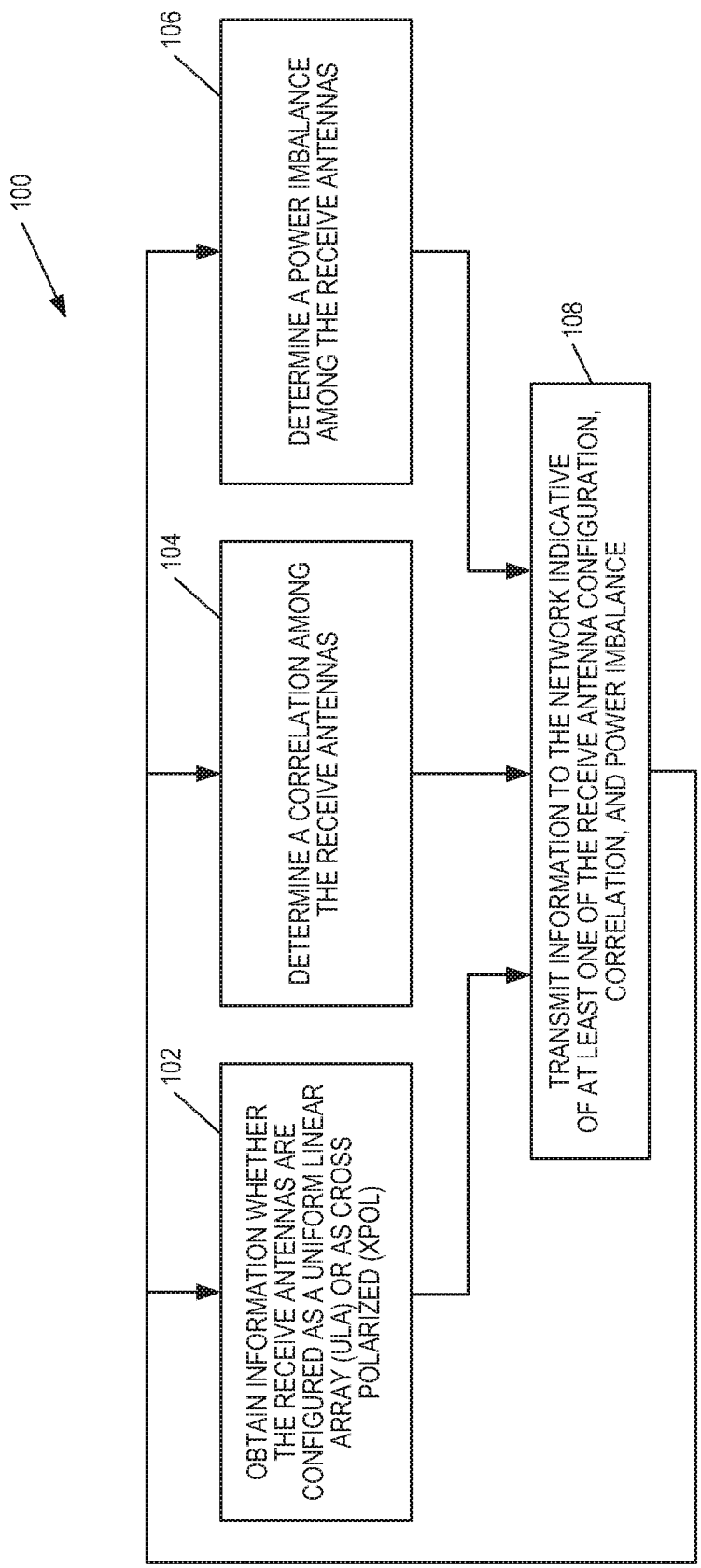
FIG. 13 is a flow diagram of a method of a UE apprising the network of dynamically changing antenna parameters.

Method in UE of Determining and Indicating Status of Antenna Configuration from UE Side FIG. 13 depicts a method 100, performed by a first UE, of informing a first network node and/or a second network node of information related to UE receive antennas. The information related to UE receive antennas may relate to the configuration of antennas (e.g., ULA or Xpol); the number of antennas; the correlation among antennas; and/or the power imbalance among antennas. The UE may obtain/determine/update any one or more of these parameters, and transmit the information to the network. This reporting may be periodic, or in response to a request from the network. FIG. 13 depicts the information determining steps in parallel, indicating that any one or more of them may be performed in any iteration. These steps include:

Obtaining (step 102) information of the antenna configuration status for each of the current active bands for the first UE if the Rx antennas is configured as ULA or Xpol (X);

Obtaining/Determining (step 104) based on one more criteria, for each of the current active bands, the correlation among the Rx antennas (Y), where the correlation can be either be a factory default value or measured from received signal or a combination of both;

Determining (step 106) based on one or more criteria the power imbalance among the Rx antennas (Z) from the first UE; and Transmitting (step 108) the determined information related to the parameter X, and/or Y, and/or Z to a first network node and/or to a second network node.

Although not depicted in FIG. 13, an additional information that the UE may obtain and report is number of Rx antennas (W), which may also be reported to the first and/or second network node.

Obtaining Rx Antenna Configuration Status

In this step 102 the first UE determines its antenna configuration status related to if the Rx antennas are configured as ULA or Xpol (X) by the first UE. If the first UE has been configured with multi-antenna then such information may also be stored in its memory. Therefore the first UE may determine this information by retrieving it from its memory.

The value (X) can be determined explicitly by the physical antenna configuration that is configured to the UE device. The indication of X can be one bit as either 0 for ULA, 1 for Xpol or vice versa. As for Xpol, the antenna configuration is paired; for 2-Rx antennas it is clear the antennas configuration is either ULA or Xpol. For 4-Rx antennas, ULA means four parallel antennas in the physical outfit, such as shown in FIG. 2. For 4-Rx Xpol, it means two pairs of cross polarized antennas. Another example of X values could be 0 for ULA, 1 for one pair of Xpol, and 2 for two pairs of Xpol configurations, where the number of antennas can be implicitly known, and that can be further used in step 104, "Obtaining/Determining Rx antenna correlation," to indicate other antenna information.

Additionally, the UE may obtain the number of Rx antennas (W). The number of Rx antennas (W) is determined from operating band and factory settings. The number of active Rx antennas can be different if operating in a low or high band. For example in high band the antennas become smaller and hence are easier to place within a device. Further, for high band it is easier to get low antenna correlation and hence the diversity gain is larger.

The UE might to change the values X and W over time. Some reasons for changing the values may be that the UE need to save battery power, or the UE entering/leaving a mode that needs either large peak throughput or more received signal power. Typically, changing the values X and W is on slow basis, at least an order of scale slower than Y and Z.

Obtaining/Determining Rx Antenna Correlation

The value (Y) can be determined in step 104 by factory setting based on average antenna correlation in the product for each band.

Alternatively, the value (Y) can be determined by the measurement procedures described above. For ULA, the indication of Y can be a double value from 0 to 1 which represents the beta value listed in Table 4. For Xpol the indication of Y can be two double values which represent the beta and gamma values listed in Table 8. Though the value Y can differ from different frequency bands once the measurements are done, it is a constant value per frequency band and can be stored in a look-up table in the UE memory. For 2-Rx antennas there is only one gamma value and no beta value. For 4-Rx antennas there are one beta value and one gamma value.

A third alternative for determining the value (Y) is to use the information both from factory setting (Y1) and measurement procedure (Y2). The combined value (Y) can for example be built up from Y=alpha1*Y1+alpha2*Y2, where alpha1+alpha2=1. Further, the weights alpha1 and alpha2 should reflect how certain the Y1 and Y2 are, i.e., if a measurement period is short the alpha2 should be close to 0.

The Rx antenna correlation may vary over time. Possible reasons are for example that a hand is placed on two antennas, which introduces an electrical connection between two antennas. Another reason the Rx antenna correlations vary over time, may be that other electrical conductive objects are close to the antenna, or moisture in the air change. Therefore the Rx correlation might need to be updated on a regular time basis, based on continuously measured and updated Rx correlation. Accordingly, the value Y may require the measurement or estimation to be performed in a time unit basis. The term current herein means the value of Y for per carrier (per frequency band) which may be applicable for at least one time unit (e.g. TTI, subframe, scheduling instance, frame etc) starting from a reference time. The reference time may be the current subframe, frame, reporting instance of control channel in UL by the first UE etc. determining the power imbalance among Rx antennas.

Determining a Power Imbalance Among the Receive Antennas

In this step 106, the first UE uses one or more criteria to determine the power imbalance among Rx antennas (Z).

The first UE continuously evaluates one or more criteria, and if conditions are conducive then the first UE may also restore partly or fully the value Z in the same way as other values, i.e., X and/or Y and/or W.

Examples of the criteria can be conducted through the signal quality, which can be represented in RSRP, RSSI, RSRQ, SINR, SNR, BLER, etc. in the LTE system measured on per-Rx antenna. Once the signal quality can be estimated per-Rx antenna the difference between two antennas or among four antennas can be used as the power imbalance value as Z.

The first UE may use any combination of the criteria mentioned above to decide the power imbalance value which can be weighted, as in dB.

Alternative example of Z can also be a dB value from each antenna where the difference can be calculated from reported information.

The power imbalance is not constant and can be impacted by various factors. One of the factors can be the shadow impact caused by the hand of users holding the mobile phone. Accordingly, the value Z may require the measurement or estimation to be performed in a time unit basis. The term current herein means the value of Z for per carrier (per frequency band) which may be applicable for at least one time unit (e.g. TTI, subframe, scheduling instance, frame etc.) starting from a reference time. The reference time may be the current subframe, frame, reporting instance of control channel in UL by the first UE, etc.

Transmitting Current Antenna Configuration Status to Network Node

In this step 108, the first UE transmits information related to the value of the parameter for per carrier, X, and/or Y, and/or Z, and/or W, obtained and determined as described above, to one or more network nodes (e.g. first network node, second network node). Some aspects related to the step 108 of reporting the said information are described below:

Reporting Mechanisms

In one aspect of this embodiment, the first UE may report the information proactively or autonomously whenever the first UE determines any change in the value of parameter, X/Y/Z/W or periodically or whenever the first UE sends uplink feedback information (e.g. HARQ feedback, measurement report, etc.).

In another aspect of this embodiment, the first UE may report the information upon receiving a request from the first or the second network node to transmit the information related to the value of parameter, X/Y/Z/W. In yet another aspect of this embodiment, the first UE may be requested by the first or the second network node to report the information only if there is any change in the value of parameter for per carrier, X/Y/Z/W, with respect to the previously determined value of the parameter for per carrier, X/Y/Z/W. In another embodiment, the UE may report X/W as one message and Y/Z as another message, since Y/Z typically change more often.

The first UE may report the information by using any of the following mechanisms:

In a first type of reporting mechanism, the first UE may transmit the information in a higher layer signaling, such as via RRC message, to the first network node or to the second network node. Such information may also be reported in a MAC message.

In a second type of reporting mechanism, the first UE may also use the unused bits or code words or fields or control space or bit pattern or bit combinations (aka spared, reserved, redundant bits or code words or control space or bit pattern or bit combinations, etc.) for indicating the information related to the determined parameter for per carrier, Z, to the first or the second network node. Typically using this mechanism the first UE sends the determined information to the first network node (e.g., to the serving base station). The unused bits herein means any set of available bits in an uplink control channel that are not used for indicating the UE about any of uplink transmission parameters—e.g., are not used for indicating uplink feedback information such as CSI related information or combined with uplink data and sent by uplink data channel.

Validity of Reported Information

The information about the value of Z for per carrier reported by the first UE to the first or the second network nodes may be considered valid by the first and the second network nodes for certain time period or time unit. Examples of such time unit are subframe, TTI, time slot, frames, etc. This may be determined based on one or more pre-defined rules and/or indications from the first UE. Examples of such rules or indications for determining the validity of the said information are:

Information is valid only in time unit in which the information is received at the network node;
Last received information remains valid until the reception of the new information at the network node;
Information is valid for L number of time units starting from a reference time, T, where T can be time when the information is received, a reference time unit (e.g. SFN=0) etc.;
Information received in certain time unit (e.g. subframe n) is valid or applicable for subframe n+m, where m is 1 or more integer value.

Figure 14:
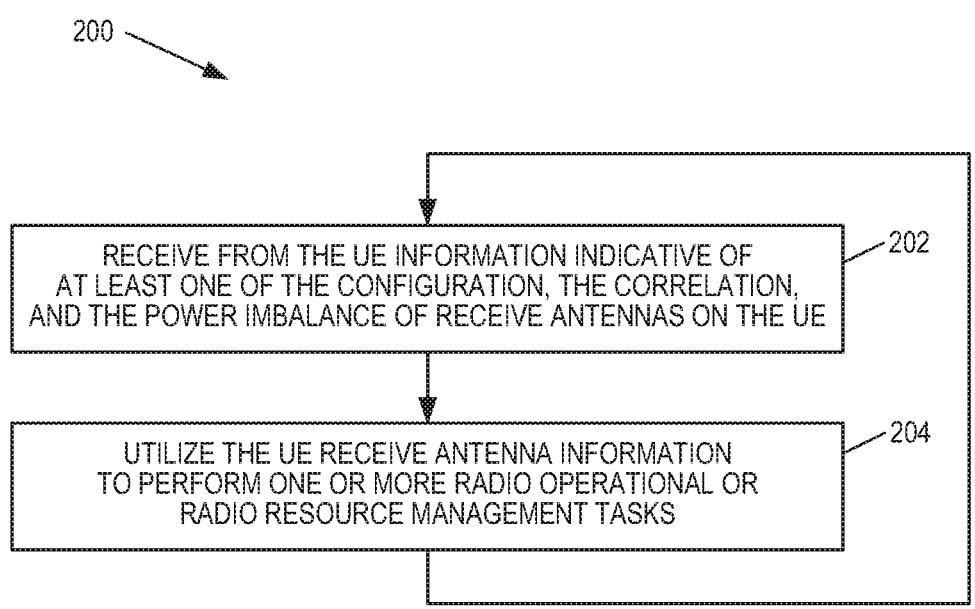
FIG. 14 is a flow diagram of a method of a network node adjusting to dynamically changing UE antenna parameters.

Method in Network Node of Using Information about Antenna Configuration Status from UE Side FIG. 14 depicts the steps of a method 200, performed by a network node operative in a wireless communication network implementing MIMO transmissions, of adjusting to dynamically changing UE antenna parameters.

In a first step 202, the network node receives (or otherwise obtains) information about the Rx antennas indicative of at least one of: whether the Rx antennas are configured as ULA or Xpol (X) by the first UE; the number of Rx antennas (W); the correlation among the Rx antennas (Y); and the power imbalance among the Rx antennas (Z) from the first UE. The UE may occasionally or periodically report the information. Additionally or alternatively, the network node may request the UE to measure and report one or more Rx antenna parameters, in which case the receive step 202 occurs in response to the request.

In a second step 204, the network node may use the information for performing one or more radio operational or radio resource management tasks. For example, the network node can add additional offset from the reported CQI based on the correlation and/or power imbalance among the Rx antennas from one or more UEs. For high correlation condition the CQI reporting may represent an optimistic channel condition so to tune down with lower MCS may bring better throughput performance to the system.

Other examples of radio operational or radio resource management tasks are:

Adapting scheduling: For example the first network node may schedule the UE with a shorter transport block size if the first UE has higher correlation among antennas. In another exemplary implementation the first network node may reduce the number of simultaneous UEs for scheduling data.

Adapting link adapting: For example the first network node may use more robust transport format (e.g. lower code rate like ½ and/or lower order modulation type like QPSK) for scheduling the first UE if the first UE has higher correlation.

Adapting the rank: If the first UE indicates that it currently has high channel correlation the network can reduce the high rank to 1 or 2 so the performance can be maintained from UE side.

Adapting transmission mode: If the UE indicate that it currently has high channel correlation, and/or few Rx antennas, and/or high power imbalance the network node can signal to the UE to change Transmission Mode to a TM that only support rank 1 transmission. By changing TM the network will reduce control signaling overhead. The network can also signal to the UE a different Code Book setup (CodeBookSubSetRestriction) in order to reduce terminal battery consumption by reduce the CQI computational complexity.

Transmitting information to other network nodes: The first network node may also signal the received information to another network node. For example the first network node may send it to the second network node (such as by Node B to RNC over Iub interface in HSPA) and/or to even a third network node (e.g. neighboring base station such as by serving eNode B to neighboring eNode over X interface in LTE), etc. The receiving network node may use the received information for one or more radio tasks. For example the RNC may adapt or modify one or more UEs (first, second or third UEs) with the correlation information provided by the UEs.

Apparatus

Figure 15:
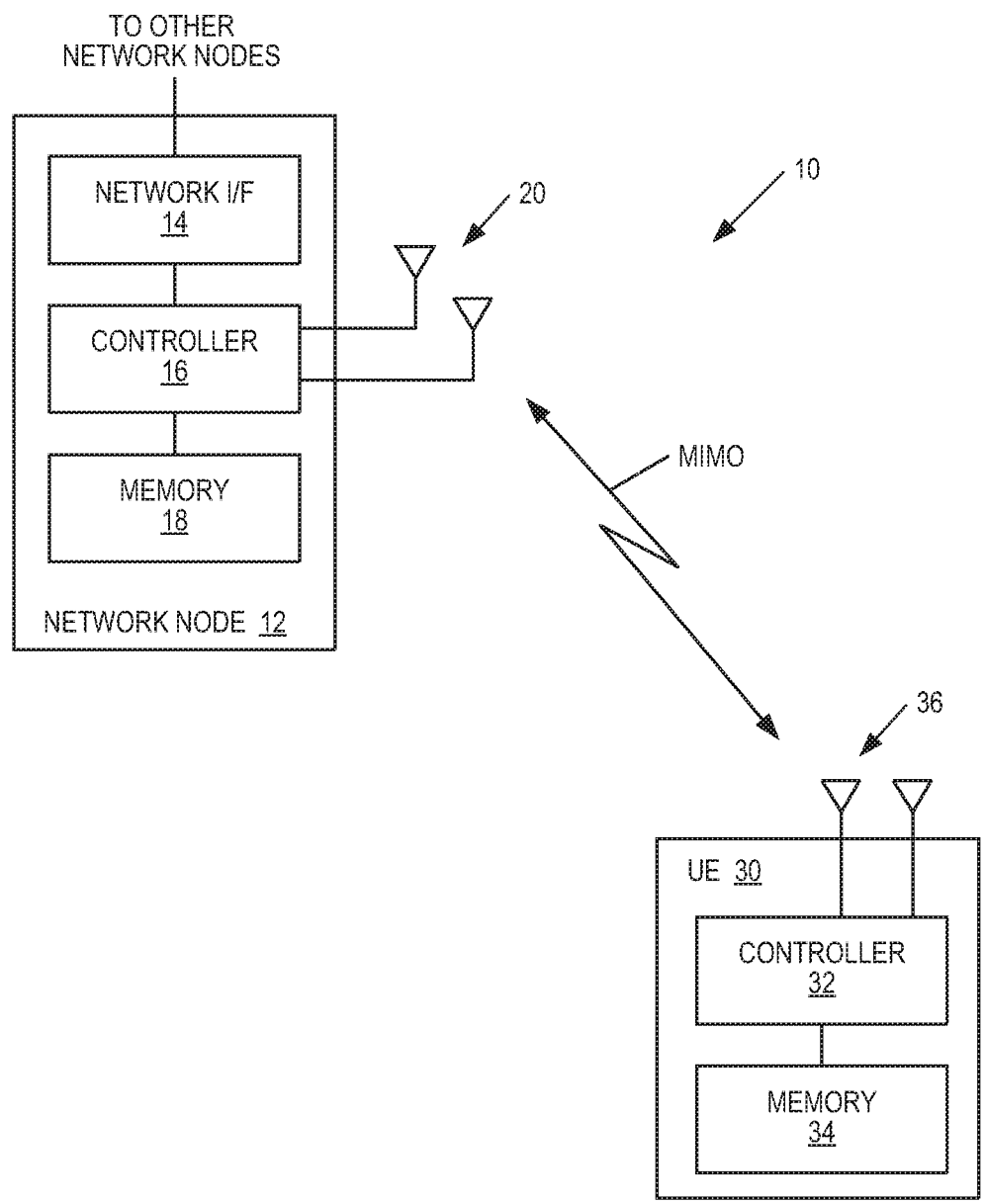
FIG. 15 is a functional block diagram of a base station and UE operative to implement MIMO reporting methods described herein.

FIG. 15 depicts a representative network node 12 and UE 30 in communication via a wireless communication network 10 that supports MIMO transmissions. The network node 12 performing the functions described above may comprise a serving node such as a base transceiver station, a base station controller, a radio network controller, a Node B or eNode B, or the like. Alternatively, any other core network node, such as an application server, may execute the described functionality, after receiving the UE 30 receive antenna parameter information from a base station or other serving network node 12. As known in the art, a network node 12 may comprise any computing platform having physical interfaces and communication circuitry operative to participate in the network protocol. In general, a network node 12 includes communication circuitry 14 operative to exchange data with other network nodes; a controller 16; memory 18; and may include radio circuitry, such as a transceiver (not shown), two or more antennas 20, and the like, to effect wireless communication across an air interface to and from one or more UE 30. The memory 18 is operative to store, and the controller 16 operative to execute, software which when executed is operative to cause the network node 12 to perform methods and functions described herein.

Similarly, a UE 30 is operative to determine and transmit MIMO antenna parameters to the network 10, as describe herein. As those of skill in the art are aware, a UE 30 is a device, which may be battery-powered and hence mobile, operative within a wireless communication network 10. The UE 30 includes a user interface (display, touchscreen, keyboard or keypad, microphone, speaker, and the like) (not shown); a controller 32; memory 34; and a radio circuitry, such as one or more transceivers (not shown), two or more antennas 36, and the like, to effect wireless communication across an air interface to one or more serving network nodes 12. The UE 30 may additionally include features (not shown) such as a camera, removable memory interface, short-range communication interface (W-Fi, Bluetooth, and the like), wired interface (USB), and the like. According to embodiments of the present invention, the memory 34 is operative to store, and the controller 32 operative to execute, software which when executed is operative to cause the UE 30 to perform methods and functions described herein.

In all embodiments, the controller 16, 32 may comprise any sequential state machine operative to execute machine instructions stored as machine-readable computer programs in the memory, such as one or more hardware-implemented state machines (e.g., in discrete logic, FPGA, ASIC, etc.); programmable logic together with appropriate firmware; one or more stored-program, general-purpose processors, such as a microprocessor or Digital Signal Processor (DSP), together with appropriate software; or any combination of the above.

In all embodiments, the memory 18, 34 may comprise any non-transitory machine-readable media known in the art or that may be developed, including but not limited to magnetic media (e.g., floppy disc, hard disc drive, etc.), optical media (e.g., CD-ROM, DVD-ROM, etc.), solid state media (e.g., SRAM, DRAM, DDRAM, ROM, PROM, EPROM, Flash memory, solid state disc, etc.), or the like.

In all embodiments, the radio circuitry may comprise one or more transceivers used to communicate with one or more other transceivers via a Radio Access Network according to one or more communication protocols known in the art or that may be developed, such as IEEE 802.xx, CDMA, WCDMA, GSM, LTE, UTRAN, WiMax, or the like. The transceiver implements transmitter and receiver functionality appropriate to the Radio Access Network links (e.g., frequency allocations and the like). The transmitter and receiver functions may share circuit components and/or software, or alternatively may be implemented separately.

In all embodiments, the communication circuitry 14 may comprise a receiver and transmitter interface used to communicate with one or more other nodes over a communication network 10 according to one or more communication protocols known in the art or that may be developed, such as Ethernet, TCP/IP, SON ET, ATM, or the like. The communication circuitry 14 implements receiver and transmitter functionality appropriate to the communication network links (e.g., optical, electrical, and the like). The transmitter and receiver functions may share circuit components and/or software, or alternatively may be implemented separately.

Advantages

Embodiments of the present invention present numerous advantages over the prior art. The network node can utilize radio resources more efficiently while taking into consideration the current status of multi-antenna configuration including the correlation and/or power imbalance among receive antennas of one or more UEs. The network node can adapt transmission mode (TM) depending upon the correlation among the Rx antennas from one or more UEs. The network node can adapt link adaptation thereby minimizing the UE and system performance loss. The network node can adapt the CQI reporting mode depending upon the number of multi-antenna that can be activated by the UE. All of these adaptations improve system performance and efficiency.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method, performed by a user equipment (UE) having a plurality of receive antennas and being operative in a wireless communication network implementing Multiple Input, Multiple Output (MIMO) transmissions, of apprising the wireless communication network of dynamically changing antenna parameters, comprising, for each active frequency band on which the UE is operating:
   performing an action selected from the group consisting of:
      obtaining receive antenna configuration information as to whether the receive antennas are configured as a Uniform Linear Array (ULA) or as Cross Polarized (Xpol); and
      determining a correlation among the receive antennas;
   determining, for each active frequency band, the number of active receive antennas; and
   transmitting information to the wireless communication network indicative of:
      the number of active receive antennas per frequency band; and
      at least one of the receive antenna configuration, and the correlation.

2. The method of claim 1 wherein obtaining receive antenna configuration information as to whether the receive antennas are configured as a ULA or as Xpol comprises reading the receive antenna configuration from memory.

3. The method of claim 1 wherein determining a correlation among the receive antennas comprises reading from memory a first correlation value for the active frequency band.

4. The method of claim 3 wherein determining the correlation among the receive antennas comprises performing two-stage MIMO Over The Air (OTA) measurement to obtain a second correlation value.

5. The method of claim 4 wherein the correlation among the receive antennas is determined according to:
   $Y = \alpha_1 Y_1 + \alpha_2 Y_2$ subject to $\alpha_1 + \alpha_2 = 1$ where:
      Y is the correlation among the receive antennas reported to the network;
      $Y_1$ is the first correlation value read from memory;
      $Y_2$ is the second correlation value determined from a two-step MIMO OTA measurement; and
      $\alpha_1$ and $\alpha_2$ are weighting factors indicating confidence in the first and second correlation values, respectively.

6. The method of claim 1 wherein transmitting information to the wireless communication network indicative of at least one of the receive antenna configuration and the correlation comprises periodically transmitting the information to the network.

7. The method of claim 6 wherein periodically transmitting the information to the wireless communication network comprises transmitting the information to the wireless communication network at a periodicity determined by a frame structure of a protocol of the wireless communication network.

8. The method of claim 1 wherein transmitting information to the wireless communication network indicative of at least one of the receive antenna configuration and the correlation comprises transmitting the information to the wireless communication network when the value of one or both of the receive antenna configuration and the correlation has changed more than a predetermined amount.

9. The method of claim 1 wherein transmitting information to the wireless communication network indicative of at least one of the receive antenna configuration and the correlation comprises transmitting the information to the wireless communication network in response to receiving a request from the network for the information.

10. The method of claim 1 wherein transmitting information to the wireless communication network indicative of at least one of the receive antenna configuration and the correlation comprises transmitting the information to the wireless communication network in one of a Radio Resource Control (RRC) message and a Media Access Control (MAC) layer message.

11. The method of claim 1 wherein transmitting information to the network indicative of at least one of the receive antenna configuration and the correlation comprises transmitting the information to the network in unused or reserved bits of an uplink control message.

12. User equipment (UE) operative in a wireless communication network implementing Multiple Input, Multiple Output (MIMO) transmissions, comprising:
a plurality of receive antennas;
memory; and
a controller operatively connected to the memory and the receive antennas, and for each active frequency band on which the UE is communicating, operative to perform an action selected from the group consisting of:
obtaining receive antenna configuration information as to whether the receive antennas are configured as a Uniform Linear Array (ULA) or as Cross Polarized (Xpol); and
determining a correlation among the receive antennas; and
further operative to:
determine, for each active frequency band, the number of active receive antennas; and
transmit information to the network indicative of:
the number of active receive antennas per frequency band; and
at least one of the receive antenna configuration, the correlation among the receive antennas, and a power imbalance.

13. The UE of claim 12 wherein the controller is operative to obtain the receive antenna configuration information as to whether the receive antennas are configured as a ULA or as Xpol by reading the receive antenna configuration information from memory.

14. The UE of claim 12 wherein the controller is operative to determine the correlation among the receive antennas by reading from memory a first correlation value for the active frequency band.

15. The UE of claim 14 wherein the controller is operative to determine the correlation among the receive antennas by performing two-stage MIMO Over The Air (OTA) measurement to obtain a second correlation value.

16. The UE of claim 15 wherein the controller is operative to determine the correlation among the receive antennas according to:
$Y = \alpha_1 Y_1 + \alpha_2 Y_2$ subject to $\alpha_1 + \alpha_2 = 1$ where:
Y is the correlation among the receive antennas reported to the network;
$Y_1$ is the first correlation value read from memory;
$Y_2$ is the second correlation value determined from a two-step MIMO OTA measurement; and
$\alpha_1$ and $\alpha_2$ are weighting factors indicating confidence in the first and second correlation values, respectively.

17. The UE of claim 12 wherein the controller is operative to transmit information to the network indicative of at least one of the receive antenna configuration and the correlation by periodically transmitting the information to the network.

18. The UE of claim 17 wherein the controller is operative to periodically transmit the information to the network by transmitting the information to the network at a periodicity determined by a frame structure of a network protocol.

19. The UE of claim 12 wherein the controller is operative to transmit information to the network indicative of at least one of the receive antenna configuration and the correlation by transmitting the information to the network when the value of one or both of the receive antenna configuration and correlation has changed more than a predetermined amount.

20. The UE of claim 12 wherein the controller is operative to transmit information to the network indicative of at least one of the receive antenna configuration and the correlation by transmitting the information to the network in response to receiving a request from the network for the information.

21. The UE of claim 12 wherein the controller is operative to transmit information to the network indicative of at least one of the receive antenna configuration and the correlation by transmitting the information to the network in one of a Radio Resource Control (RRC) message and a Media Access Control (MAC) layer message.

22. The UE of claim 12 wherein the controller is operative to transmit information to the network indicative of at least one of the receive antenna configuration and the correlation by transmitting the information to the network in unused or reserved bits of an uplink control message.

23. A non-transitory computer-readable storage medium, having stored thereon a computer program operative to cause a processor in a user equipment (UE) having two or more receive antennas to perform, for each active frequency band on which the UE communicates, the steps of:
performing an action selected from the group consisting of:
obtaining receive antenna configuration information as to whether the receive antennas are configured as a Uniform Linear Array (ULA) or as Cross Polarized (Xpol); and
determining a correlation among the receive antennas;
determine, for each active frequency band, the number of active receive antennas; and
transmitting information to the network indicative of:
the number of active receive antennas per frequency band; and
at least one of the receive antenna configuration, the correlation, and power imbalance.

* * * * *